United States Patent
Yamamoto et al.

(10) Patent No.: US 6,879,041 B2
(45) Date of Patent: Apr. 12, 2005

(54) SEMICONDUCTOR DEVICE WITH JOINT STRUCTURE HAVING LEAD-FREE SOLDER LAYER OVER NICKEL LAYER

(75) Inventors: Kenichi Yamamoto, Kodaira (JP);
Toshiaki Morita, Hitachi (JP);
Munehiro Yamada, Hachioji (JP);
Ryosuke Kimoto, Hamura (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/396,326

(22) Filed: Mar. 26, 2003

(65) Prior Publication Data

US 2003/0197277 A1 Oct. 23, 2003

(30) Foreign Application Priority Data

Apr. 17, 2002 (JP) ........................................ 2002-114408

(51) Int. Cl.[7] .......................... H01L 23/48; H01L 23/52; H01L 29/40
(52) U.S. Cl. ...................... 257/737; 257/738; 257/748; 257/779; 257/780; 257/781
(58) Field of Search .................... 257/737–738, 257/748, 779–781

(56) References Cited

U.S. PATENT DOCUMENTS 6,384,344 B1 * 5/2002 Asai et al. .................. 174/261
6,548,898 B2 * 4/2003 Matsuki et al. ............. 257/746

FOREIGN PATENT DOCUMENTS

| JP | 06-034983 | 2/1994 |
| JP | 2001-144214 | 5/2001 |
| JP | 2002-146548 | 5/2002 |

OTHER PUBLICATIONS

Karashima, Takashi et al., "Solder Joint Reliability of BGA Package Using Pb–Free Solder Ball", *MES 2001,* Oct. 2001 pp. 47–50.

* cited by examiner

*Primary Examiner*—Thien F Tran

(57) ABSTRACT

The impact strength resistance of a solder joint portion of a semiconductor device is improved. The semiconductor device has a joint structure wherein a jointing layer which does not contain sulfur substantially is arranged between an underlying conductive layer and a lead-free solder layer and further between the jointing layer and the lead-free solder layer is formed an alloy layer comprising elements of these layers.

5 Claims, 32 Drawing Sheets

9b (B: Sn-Ni-Cu)
9a (A: Sn-Ni-Cu)

A LAYER COMPOSITION ≠ B LAYER COMPOSITION 9b (B: Sn-Ni-Cu)
9a (A: Sn-Ni-Cu)

A LAYER COMPOSITION ≠ B LAYER COMPOSITION 9b (B: Sn-Ni-Cu)
9a (A: Sn-Ni-Cu)

A LAYER COMPOSITION ≠ B LAYER COMPOSITION 9b (B: Sn-Ni-Cu)
9a (A: Sn-Ni-Cu)

A LAYER COMPOSITION ≠ B LAYER COMPOSITION 9b (B: Sn-Ni-Cu)
9a (A: Sn-Ni-Cu)

A LAYER COMPOSITION ≠ B LAYER COMPOSITION

SEMICONDUCTOR DEVICE WITH JOINT STRUCTURE HAVING LEAD-FREE SOLDER LAYER OVER NICKEL LAYER

BACKGROUND OF THE INVENTION

The present invention relates to a semiconductor device, a method of manufacturing the same, an electronic instrument, and a technique of manufacturing the same, in particular, a semiconductor device integrated into a portable instrument, and a technique which is effectively applied to an electronic instrument.

As a semiconductor device, for example, a semiconductor device called BGA (ball grid array) type device is known. This BGA type semiconductor device has a package structure wherein semiconductor chips are mounted on the side of the main face of a wiring board called interposer and plural solder bumps are arranged, as terminals for external connection, on the rear face side which is opposite to the main face of the wiring board.

BGA type semiconductor devices having various structures have been developed and made practicable as manufactured goods. The structures of the BGA type semiconductor devices are roughly classified into wire bonding structures and face down bonding structures. In the wire bonding structures, an electrode pad arranged on the main face of a semiconductor chip is electrically connected to an electrode pad arranged on the main face of an interposer by means of a bonding wire. In the face down bonding structures, an electrode pad arranged on the main face of a semiconductor chip is electrically connected to an electrode pad arranged on the main face of an interposer by means of a solder bump interposed between these pads.

A BGA type semiconductor device having a wire bonding structure is disclosed in, for example, JP-A (Japanese Patent Application Laid-Open) No. 2001-144214.

A BGA type semiconductor device having a face down bonding structure is disclosed in, for example, JP-A No. Hei 6(1994)-34983.

SUMMARY OF THE INVENTION

In recent years, an adverse effect of Pb (lead) on the environment has been regarded as a problem. Thus, in semiconductor devices, technique for making Pb free has been actively investigated. In BGA type semiconductor devices, as a terminal for external connect, there is generally used a solder bump having a Pb—Sn (tin) eutectic composition (63[wt %]Pb—37[wt %]Sn) having a low melting point. At present, however, Pb-free solder bumps, for example, solder bumps having composition of a Sn—Ag (silver) —Cu (copper) are being used.

However, Pb-free solder bumps are harder than solder bumps having a Pb—Sn eutectic composition; therefore, it is desired to improve impact strength resistance of a solder joint portion after a BGA type semiconductor device is mounted on a mount board. A BGA type semiconductor device is mounted on a mount board so as to be integrated into any one of various electronic instruments. In particular, portable electronic instruments such as a portable telephone are exposed to danger of falling by user's carelessness. Thus, for the instruments, impact strength resistance is desired which does not cause inconveniences such as a crack in their solder joint portions even if an impact based on falling is applied to the instruments. BGA type semiconductor devices have been made small-sized and the pitch of circuits therein has been made narrower. As a result, the area of their solder joint portions has been becoming smaller. Therefore, it is desired to improve the impact strength of the solder joint portions.

Thus, the inventors investigated the impact strength resistance of a solder joint portion in the case of using a Pb-free solder bump as a terminal for external connection. As a result, it has been found out that the impact strength resistance of the solder joint portion is low, and it has also been found out that a jointing layer made of a plating layer containing, for example, Ni (nickel) as a main component is deposited on an electrode pad arranged on an interposer or a mount board in order to make the bondability between the pad and the solder bump high, and the impact strength resistance of the solder joint portion is lowered by effect of impurities, such as sulfur (S), carbon (C), fluorine (F), oxygen ($O_2$) and chlorine (Cl), contained in this jointing layer. The impact strength resistance of the solder joint portion, dependently on these impurities, will be described in detail later.

Eleventh Microelectronics Symposium Collected Papers (MES 2001, "Inspection of Lead-Free Solder Bonding Reliability of BGA Type Elements" pp. 47 to 50, October 2001) reports crack of a solder joint portion by shearing stress in the case of using a Pb-free solder bump as a terminal for external connection of a BGA type semiconductor device, but does not discuss impact strength resistance.

An object of the present invention is to provide a technique making it possible to improve the impact strength resistance of a solder joint portion.

The above-mentioned object of the present invention, other objects thereof, and new features thereof will be apparent from the description of the present specification and the attached drawings.

Outlines of typical aspects of the present invention disclosed in the present application will briefly be described as follows.

(1) The semiconductor device of the present invention has a joint structure in which a jointing layer which does not contain sulfur substantially is arranged between an underlying conductive layer and a lead-free solder layer, and an alloy layer comprising elements of these layers is further formed between the jointing layer and the lead-free solder layer. The jointing layer is a plating layer made mainly of nickel or a plating layer made mainly of nickel and phosphorus. The solder layer is a bump made of a tin-based alloy material. The underlying conductive layer is an electrode pad of a wiring board, and the jointing layer is a plating layer formed on the surface of the electrode pad. The solder layer is a bump jointed to the jointing layer.

(2) The manufacture of a semiconductor device of the present invention comprises the steps of: preparing a wiring board comprising, on its rear face opposite to its main face, a formed electrode pad, and comprising a jointing layer, which does not contain sulfur substantially, formed on the surface of the electrode pad; mounting a semiconductor chip on the main face of the wiring board; and melting a lead-free solder material onto the jointing layer to form a bump.

(3) The electronic instrument of the present invention has a joint structure in which a lead-free solder layer is interposed between an electrode pad of an electronic member and an electrode pad of a wiring board, a jointing layer which does not contain sulfur substantially is interposed between the electrode pad of the electronic member and the lead-free solder layer, and further between the jointing layer and the lead-free solder layer is interposed an alloy layer containing elements of these layers.

(4) The electronic instrument of the present invention has a joint structure in which a lead-free solder layer is interposed between an electrode pad of an electronic member and an electrode pad of a wiring board, a jointing layer which does not contain sulfur substantially is interposed between the electrode pad of the wiring board and the lead-free solder layer, and further between the jointing layer and the lead-free solder layer is interposed an alloy layer containing elements of these layers.

(5) The manufacture of an electronic instrument of the present invention comprises the steps of: preparing an electronic member having an electrode pad comprising, on its surface, a formed jointing layer which does not contain sulfur substantially; and melting a lead-free solder layer interposed between an electrode pad of a wiring board and the jointing layer of the electronic member, thereby jointing the jointing layer and the electrode pad of the wiring board.

(6) The manufacture of an electronic instrument of the present invention comprises the steps of: preparing an electronic member having an electrode pad, and a wiring board having an electrode pad comprising, on its surface, a formed jointing layer which does not contain sulfur substantially; and melting a lead-free solder layer interposed between the jointing layer of the electronic member and the electrode pad of the electronic member, thereby jointing the jointing layer and the electrode pad of the electronic member.

(7) In any one of the means (1) to (6), the concentration of sulfur in the jointing layer is 1% or less as the ratio of the sulfur ion number to the ion count number of the jointing layer in secondary ion mass spectrometry.

(8) The semiconductor device of the present invention has a joint structure in which a jointing layer which does not contain carbon substantially is arranged between an underlying conductive layer and a lead-free solder layer, and further between the jointing layer and the lead-free solder layer is formed an alloy layer comprising elements of these layers.

(9) The electronic instrument of the present invention has a joint structure in which a lead-free solder layer is interposed between an electrode pad of an electronic member and an electrode pad of a wiring board, a jointing layer which does not contain carbon substantially is interposed between the electrode pad of the electronic member and the lead-free solder layer, and further between the jointing layer and the lead-free solder layer is interposed an alloy layer containing elements of these layers.

(10) The electronic instrument of the present invention has a joint structure in which a lead-free solder layer is interposed between an electrode pad of an electronic member and an electrode pad of a wiring board, a jointing layer which does not contain carbon substantially is interposed between the electrode pad of the wiring board and the lead-free solder layer, and further between the jointing layer and the lead-free solder layer is interposed an alloy layer containing elements of these layers.

(11) In any one of the means (8) to (10), the concentration of carbon in the jointing layer is 1% or less as the ratio of the carbon ion number to the ion count number of the jointing layer in secondary ion mass spectrometry.

(12) The semiconductor device of the present invention has a joint structure in which a jointing layer which does not contain fluorine substantially is arranged between an underlying conductive layer and a lead-free solder layer, and further between the jointing layer and the lead-free solder layer is formed an alloy layer comprising elements of these layers.

(13) The electronic instrument of the present invention has a joint structure in which a lead-free solder layer is interposed between an electrode pad of an electronic member and an electrode pad of a wiring board, a jointing layer which does not contain fluorine substantially is interposed between the electrode pad of the electronic member and the lead-free solder layer, and further between the jointing layer and the lead-free solder layer is interposed an alloy layer containing elements of these layers.

(14) The electronic instrument of the present invention has a joint structure in which a lead-free solder layer is interposed between an electrode pad of an electronic member and an electrode pad of a wiring board, a jointing layer which does not contain fluorine substantially is interposed between the electrode pad of the wiring board and the lead-free solder layer, and further between the jointing layer and the lead-free solder layer is interposed an alloy layer containing elements of these layers.

(15) In any one of the means (12) to (14), the concentration of fluorine in the jointing layer is 0.2% or less as the ratio of the fluorine ion number to the ion count number of the jointing layer in secondary ion mass spectrometry.

(16) The semiconductor device of the present invention has a joint structure in which a jointing layer which does not contain oxygen substantially is arranged between an underlying conductive layer and a lead-free solder layer and further between the jointing layer and the lead-free solder layer is formed an alloy layer comprising elements of these layers.

(17) The electronic instrument of the present invention has a joint structure in which a lead-free solder layer is interposed between an electrode pad of an electronic member and an electrode pad of a wiring board, a jointing layer which does not contain oxygen substantially is interposed between the electrode pad of the electronic member and the lead-free solder layer, and further between the jointing layer and the lead-free solder layer is interposed an alloy layer containing elements of these layers.

(18) The electronic instrument of the present invention has a joint structure in which a lead-free solder layer is interposed between an electrode pad of an electronic member and an electrode pad of a wiring board, a jointing layer which does not contain oxygen substantially is interposed between the electrode pad of the wiring board and the lead-free solder layer, and further between the jointing layer and the lead-free solder layer is interposed an alloy layer containing elements of these layers.

(19) In any one of the means (16) to (18), the concentration of oxygen in the jointing layer is 10% or less as the ratio of the oxygen ion number to the ion count number of the jointing layer in secondary ion mass spectrometry.

(20) The semiconductor device of the present invention has a joint structure in which a jointing layer which does not contain chlorine substantially is arranged between an underlying conductive layer and a lead-free solder layer and further between the jointing layer and the lead-free solder layer is formed an alloy layer comprising elements of these layers.

(21) The electronic instrument of the present invention has a joint structure in which a lead-free solder layer is interposed between an electrode pad of an electronic member and an electrode pad of a wiring board, a jointing layer which does not contain chlorine substantially is interposed between the electrode pad of the electronic member and the lead-free solder layer, and further between the jointing layer and the lead-free solder layer is interposed an alloy layer containing elements of these layers.

(22) The electronic instrument of the present invention has a joint structure in which a lead-free solder layer is interposed between an electrode pad of an electronic member and an electrode pad of a wiring board, a jointing layer which does not contain chlorine substantially is interposed between the electrode pad of the wiring board and the lead-free solder layer, and further between the jointing layer and the lead-free solder layer is interposed an alloy layer containing elements of these layers.

(23) In any one of the means (20) to (22), the concentration of chlorine in the jointing layer is 10% or less as the ratio of the chlorine ion number to the ion count number of the jointing layer in secondary ion mass spectrometry.

DETAILED DESCRIPTION OF THE PREFERRED EMBODIMENTS

Referring to the attached drawings, embodiments of the present invention will be described in detail hereinafter. In all of the drawings, which are referred to in order to describe the embodiments of the present invention, the same reference numbers are attached to members having the same functions, and repeated description is omitted. In order to make the description simple, ratios between dimensions of the respective members are different from actual ratios. In order to make the drawings easy to view, hatchings for showing sections are partially omitted.

Embodiment 1

In the present embodiment 1, examples wherein the present invention is applied to a BGA type semiconductor device having a wire bonding structure and a module into which the device is integrated will be described.

Figure 1:
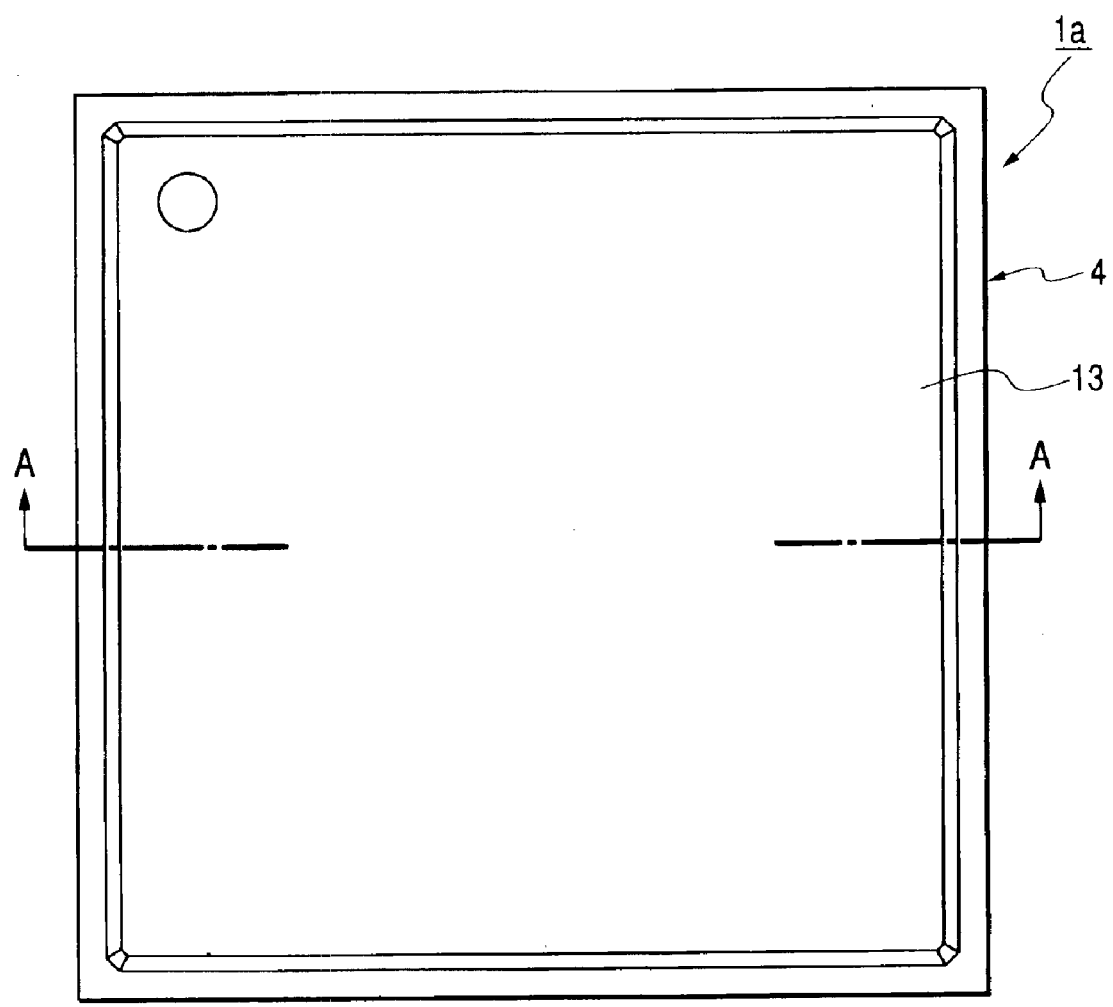
FIG. 1 is a plan view illustrating an outline of a BGA type semiconductor device according to an embodiment 1 of the present invention.
Figure 2:
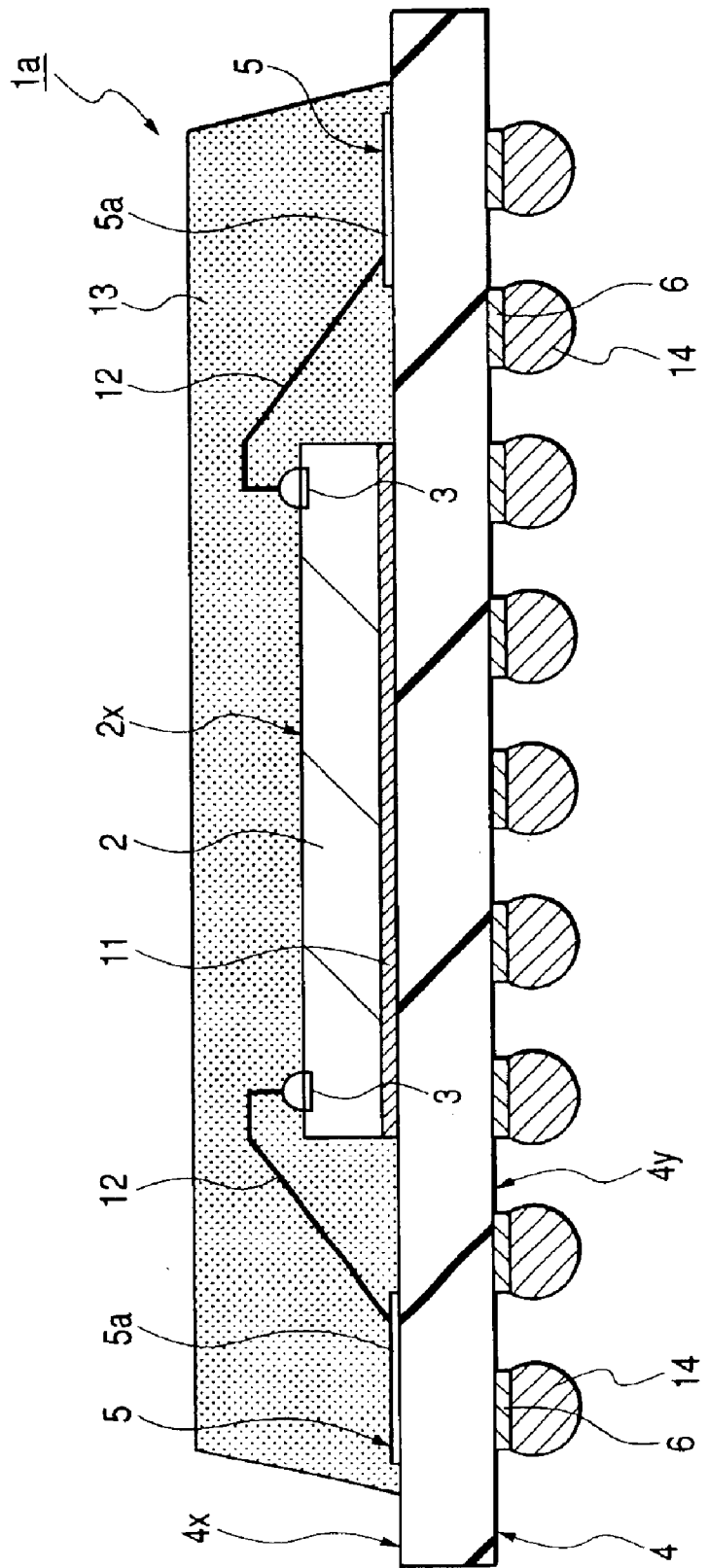
FIG. 2 is a sectional view taken along A—A line of FIG. 1.
Figure 3:
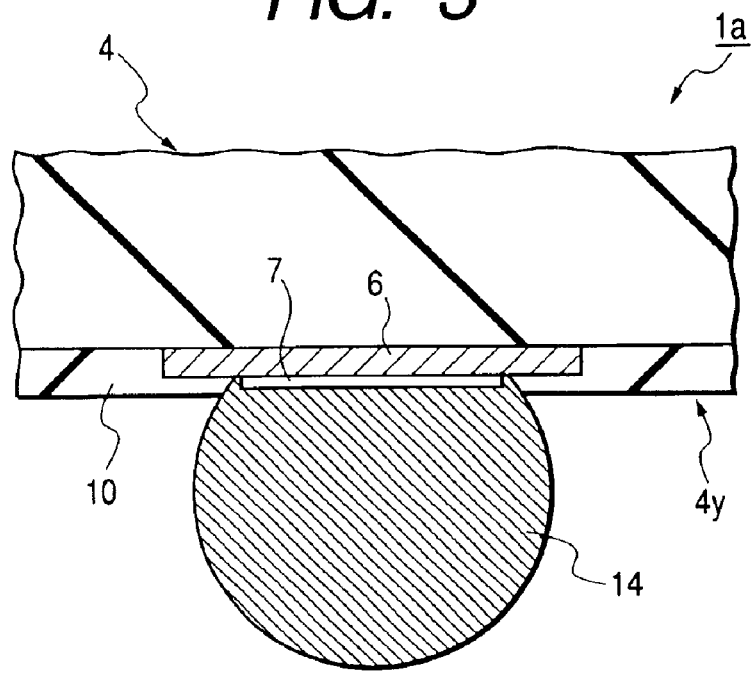
FIG. 3 is a partially enlarged sectional view of FIG. 2.
Figure 4:
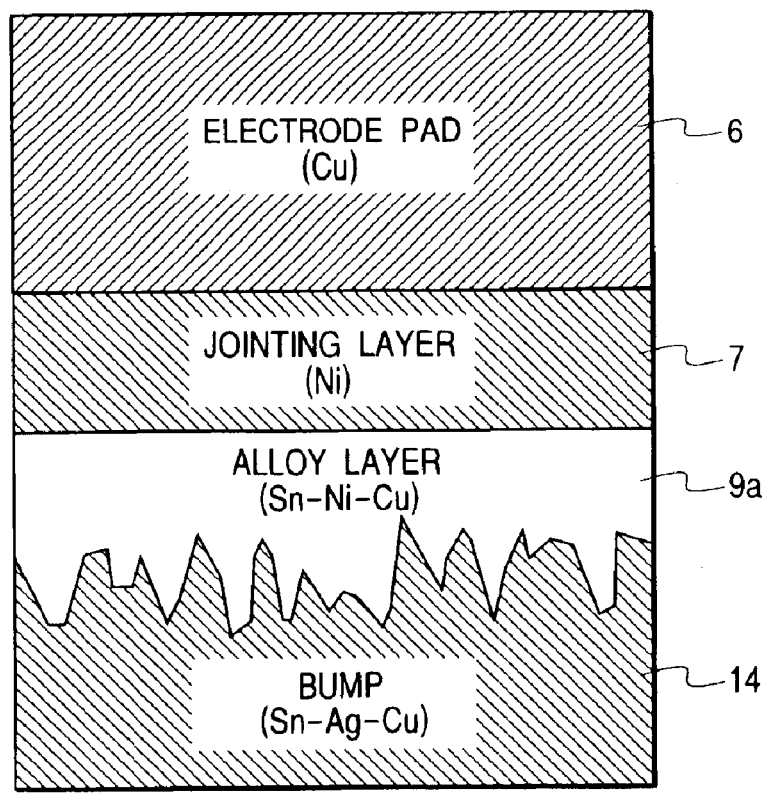
FIG. 4 is a partially enlarged sectional view of FIG. 3.
Figure 5A:
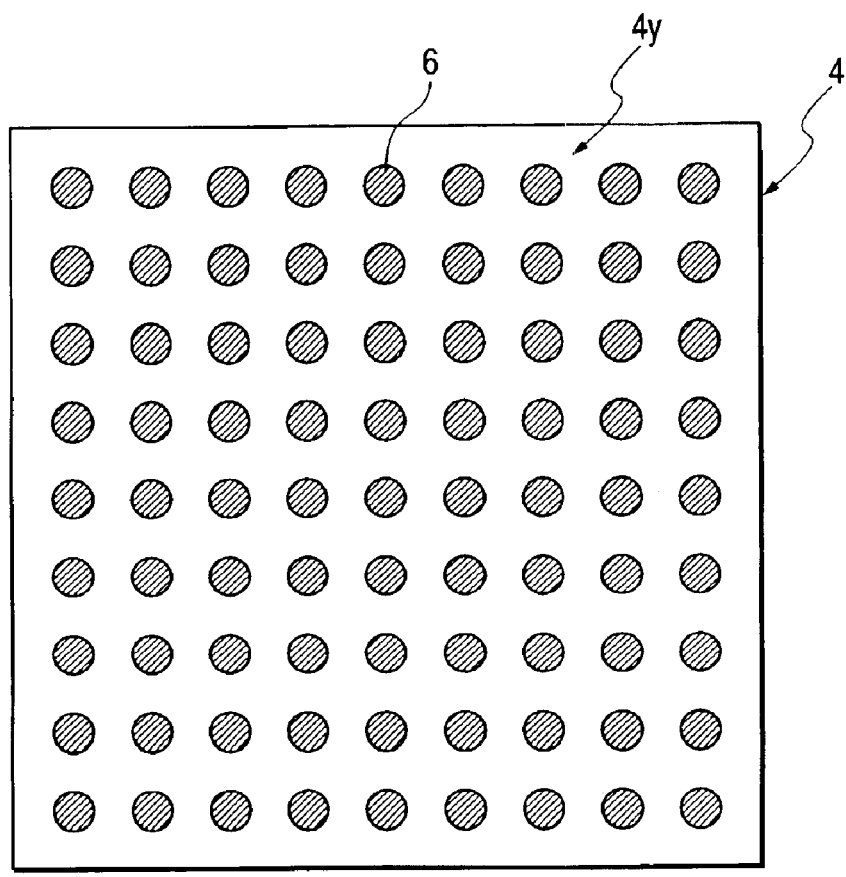
FIGS. 5(a) and 5(b) are views illustrating an outline of an interposer (wiring board) used in the manufacture of the BGA type semiconductor device according to the embodiment 1 of the present invention (FIG. 5(a) is a bottom view thereof, and FIG. 5(b) is a sectional view thereof).
Figure 5B:
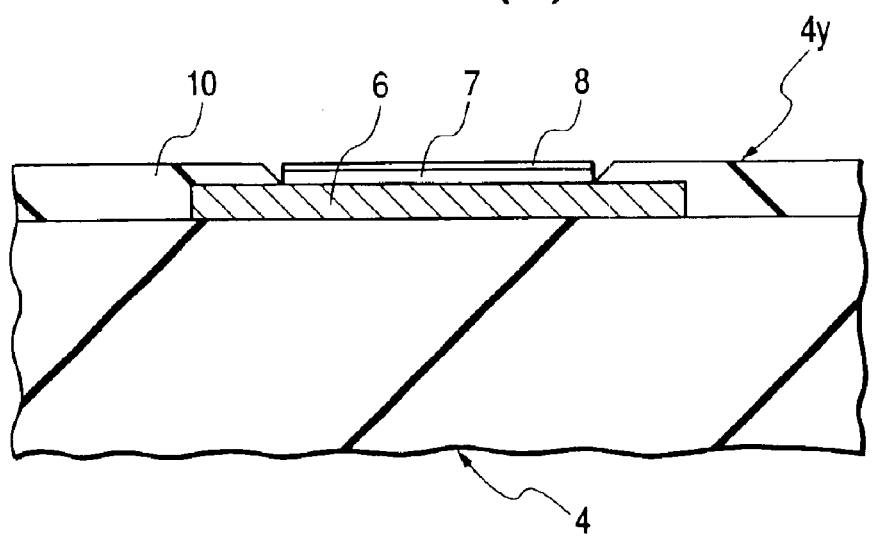
Figure 7A:
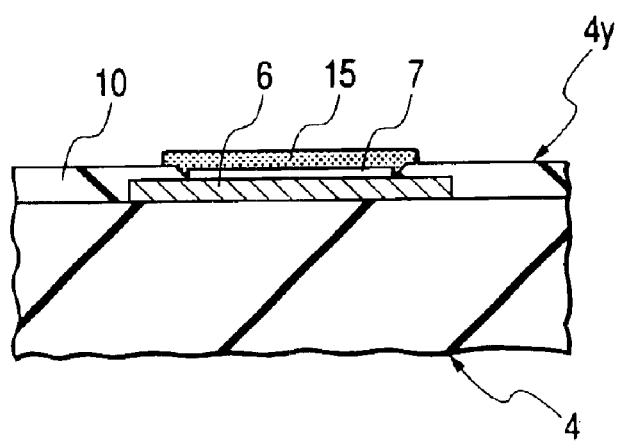
FIGS. 7(a) to 7(c) are views for explaining a first process for forming bumps in the manufacture of the BGA type semiconductor device according to the embodiment 1 of the present invention (FIGS. 7(a) to 7(c) are sectional views in respective steps thereof).
Figure 7B:
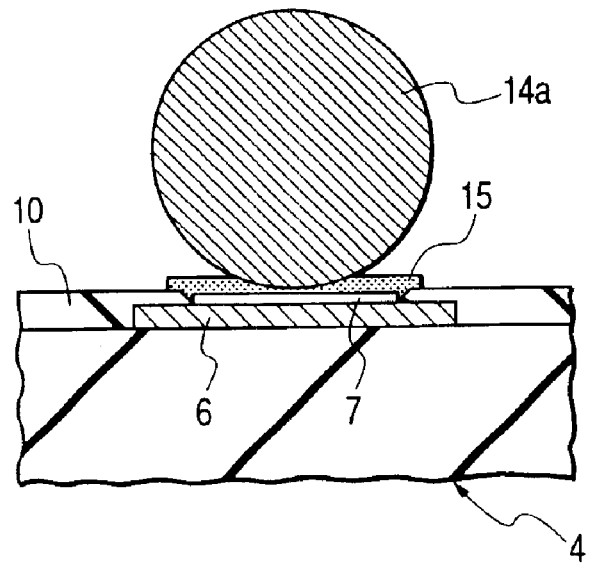
Figure 7C:
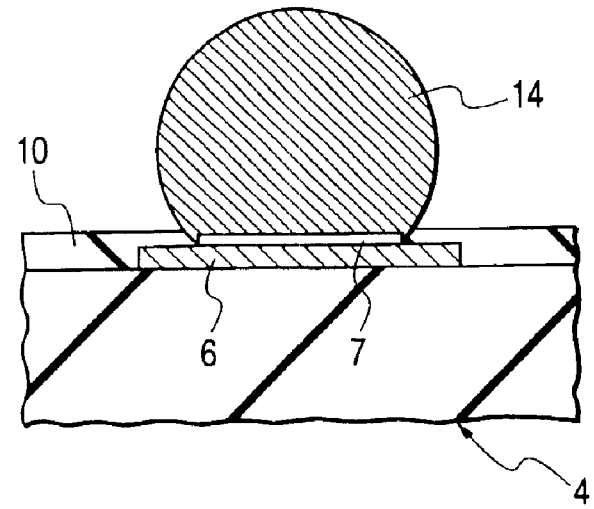
Figure 8A:
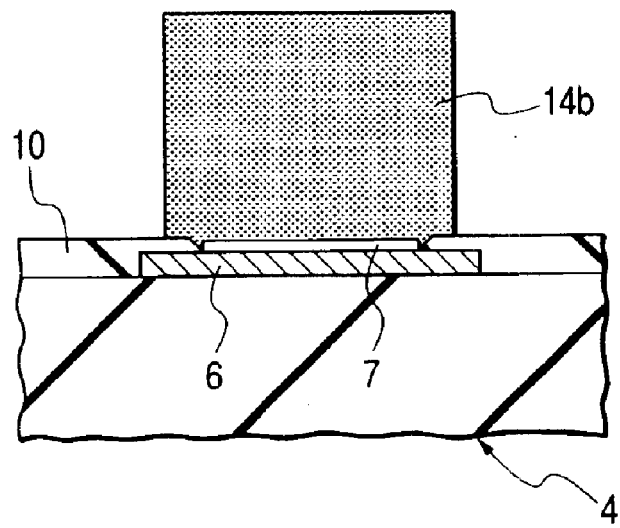
FIGS. 8(a) and 8(b) are views for explaining a second process for forming bumps in the manufacture of the BGA type semiconductor device according to the embodiment 1 of the present invention (FIGS. 8(a) and 8(b) are sectional views in respective steps thereof).
Figure 8B:
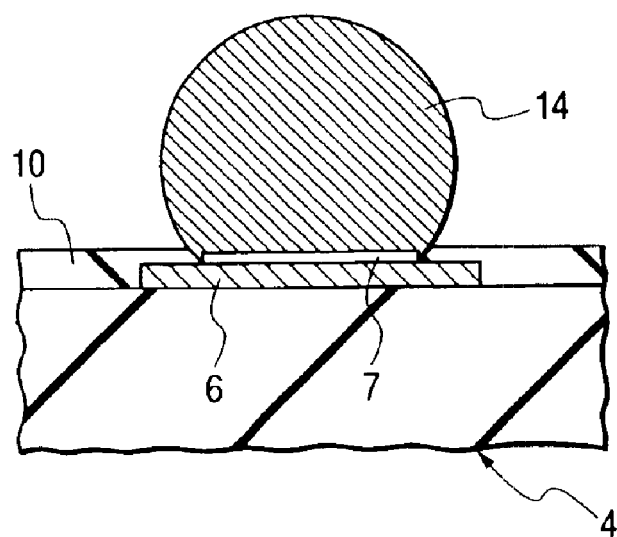

FIG. 1 is a plan view illustrating an outline of the BGA type semiconductor device, which is according to the embodiment 1 of the present invention, FIG. 2 is a sectional view taken along A—A line of FIG. 1, FIG. 3 is a partially enlarged sectional view of FIG. 2, FIG. 4 is a partially enlarged sectional view of FIG. 3, FIGS. 5(a) and 5(b) are views illustrating an outline of an interposer (wiring board) used in the manufacture of the BGA type semiconductor device according to the embodiment 1 of the present invention (FIG. 5(a) is a bottom view thereof, and FIG. 5(b) is a sectional view thereof). FIGS. 6(a) to 6(d) are views for explaining the manufacture of the semiconductor device according to the embodiment 1 of the present invention (FIGS. 6(a) to 6(d) are sectional views in respective steps thereof), FIGS. 7(a) to 7(c) are views for explaining a first process for forming bumps in the manufacture of the BGA type semiconductor device according to the embodiment 1 of the present invention (FIGS. 7(a) to 7(c) are sectional views in respective steps thereof), and FIGS. 8(a) and 8(b) are views for explaining a second process for forming bumps in the manufacture of the BGA type semiconductor device according to the embodiment 1 of the present invention (FIGS. 8(a) and 8(b) are sectional views in respective steps thereof).

As illustrated in FIGS. 1 and 2, the BGA type semiconductor device 1a of the present embodiment 1 has a package structure in which a semiconductor chip 2 is mounted on the side of a main face 4x of an interposer (wiring board) 4 and plural solder bumps 14 are arranged, as terminals for external connection, on the side of a rear face 4y, which is opposite to the main face 4x of the interposer 4 (that is, which is positioned on the side opposite to the main face 4x of the interposer 4).

In the semiconductor chip 2, its plane crossing the thickness direction thereof has a rectangular shape or square shape. In the present embodiment, the plane is, for example, a plane 6.0 mm square. The semiconductor chip 2 is not limited to this, and has a structure composed mainly of a semiconductor substrate, plural transistor elements formed on a main face of this semiconductor substrate, a multilayered wiring layer wherein plural laminates, each of which is made of an insulating layer and a wiring layer, are stacked on the main face of the semiconductor substrate, and a surface protective layer (final protective layer) formed to cover this multilayered wiring layer. The semiconductor substrate is made of, for example, monocrystal silicon. The insulating layer is made of, for example, a silicon oxide film. The wiring layer is made of an aluminum (Al), aluminum alloy, copper (Cu) or copper alloy film, or some other metal film. The surface protective film is made of, for example, a multilayered film wherein inorganic insulating films such as a silicon oxide film and a silicon nitride, or organic insulating films are stacked.

The semiconductor chip 2 has, for example, control circuits as integrated circuits therein. The control circuits are mainly composed of transistor elements formed on the main face of the semiconductor substrate, and wires formed on the multilayered wiring layer.

Plural electrode pads 3 are formed on the main face 2x of the semiconductor chip 2. The electrode pads 3 are formed on the uppermost wiring layer of the respective layers which constitute the multilayered wiring layer of the semiconductor chip 2, and are exposed from bonding openings made in the surface protective film of the semiconductor chip 2. The electrode pads 3 are arranged along the respective sides of the main face 2x of the semiconductor chip 2.

The semiconductor chip 2 is bonded and fixed to the main face 4x of the interposer 4 in the state that an adhesive agent 11 is interposed between the rear face 2y of the chip 2 and the main face 4x of the interposer.

In the interposer 4, its plane crossing the thickness direction thereof has a rectangular shape or square shape. In the present embodiment, the plane is, for example, a plane 13.0 mm square. The interposer 4 is not limited to this, and has a structure composed mainly of a core material, a protective film formed to cover the main face of the core material, and a protective film (reference number 10 in FIG. 3) formed to cover the rear face opposite to the main face of this core material (that is, the face positioned on the side opposite to the main face of the core material). The core material has, for example, a multilayered wiring structure having wires on two faces (i.e., the surface and the rear face) thereof. Each of the insulating layers which constitute the core material is made of, for example, a high-elasticity resin substrate wherein glass fiber is impregnated with epoxy resin or polyimide resin. Each of the wiring layers which constitute the core material is made of, for example, a metal film which mainly comprises Cu. The protective film on the main face of the core material is formed mainly to protect wires 5 formed on the uppermost wiring layer of the core material, and the protective film on the rear face of the core material is formed mainly to protect wires formed on the lowermost wiring layer of the core material. The protective films on the main face and the rear face of the core material are made from, for example, two-liquid alkali developer type solder resist ink or one-liquid thermosetting type solder resist ink.

Plural electrode pads 5a are formed on the main face 4x of the interposer 4, and plural electrode pads 6 are formed on the rear face 4y of the interposer 4. Each of the electrode pads 5a is made of a part of each of plural wires 5 formed on the uppermost wiring layer of the core material, and is exposed from an opening made in the protective film on the main face of the core material. Each of the electrode pads 6 is made of a part of each of plural wires formed on the lowermost wiring layer of the core material, and is exposed from an opening made in the protective film on the rear face of the core material. The electrode pads 5a are arranged outside the semiconductor chip 2, correspondingly to the electrode pads 3 of the semiconductor chip 2. The electrode pads 6 are arranged, for example, in an array form, as illustrated in FIG. 5(a).

The electrode pads 3 formed on the main face 2x of the semiconductor chip 2 are electrically connected to the electrode pads 5a formed on the main face 4x of the interposer 4, respectively, through bonding wires 12. As the bonding wires 12, for example, gold (Au) wires are used. As the method for connecting the bonding wires 12, for example, a ball bonding (nail head bonding) method, wherein thermocompressing bonding and ultrasonic vibration are used, is used.

The semiconductor chip 2, the bonding wires 12, and so on are sealed with a resin sealant 13 formed on the main face 4x of the interposer 4. The resin sealant 13 is made of, for example, an epoxy thermosetting insulating resin to which a phenolic hardener, a silicone rubber, many fillers (for example, silica) and so on are added. As the method of forming the resin sealant 13, for example, transfer molding, which is suitable for mass production, is used.

The solder bumps 14 are fixed and bonded to the electrode pads 6 formed on the rear face 4y of the interposer 4, respectively, and they are electrically and mechanically connected. As the solder bumps 14, there are used Pb-free solder bumps, which do not contain Pb substantially, for example, solder bumps having a composition of Sn-1[wt %]Ag-0.5[wt %]Cu.

As illustrated in FIG. 3, a jointing layer 7 is deposited on the surface of the electrode pads 6 on the side of the rear face 4y of the interposer 4 in order to make the bondability between the pads 6 and the solder bumps 14 high. In the present embodiment, the jointing layer 7 is made of a Ni plating layer which contains Ni as a main component but does not contain sulfur substantially.

As illustrated in FIG. 4, between the jointing layer 7 and the solder bumps 14 is formed an alloy layer (intermetallic compound layer) 9a having a composition of Sn—Ni—Cu, which contains elements of these layers. By joint between the jointing layer 7 and the solder bumps 14 through this alloy layer 9a, the electrode pads 6 are fixed and bonded to the solder bumps 14. In other words, the BGA type semiconductor device 1a of the present embodiment has a structure in which the jointing layer 7 which does not contain sulfur substantially is deposited between the electrode pads (underlying conductive layer) 6 of the interposer 4 and the solder bumps (lead-free solder layer) 14 having a Pb-free composition, and further between the jointing layer 7 and the solder bumps 14 having the Pb-free composition (lead-free solder layer) is formed the alloy layer 9a which contains elements of these layers.

At the stage before the solder bumps 14 are formed on the electrode pads 6, a Au (gold) film 8 made of a plating layer is formed as an antioxidation film on the surface of the jointing layer 7, as illustrated in FIG. 5(b). Since this Au film 8 is generally made to have a small film thickness of about 1 μm, the film 8 becomes extinct by diffusion at the time of the formation of the solder bumps 14.

The following will describe the manufacture of the BGA type semiconductor device 1a, referring to FIGS. 6 to 8.

Figure 6A:
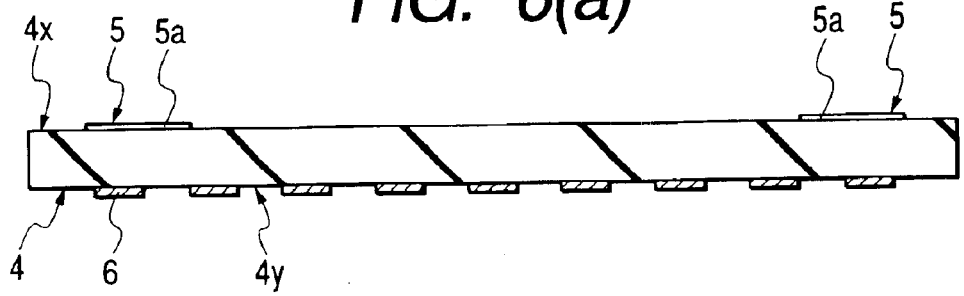
FIGS. 6(a) to 6(d) are views for explaining the manufacture of the BGA type semiconductor device according to the embodiment 1 of the present invention (FIGS. 6(a) to 6(d) are sectional views in respective steps thereof).
Figure 6B:
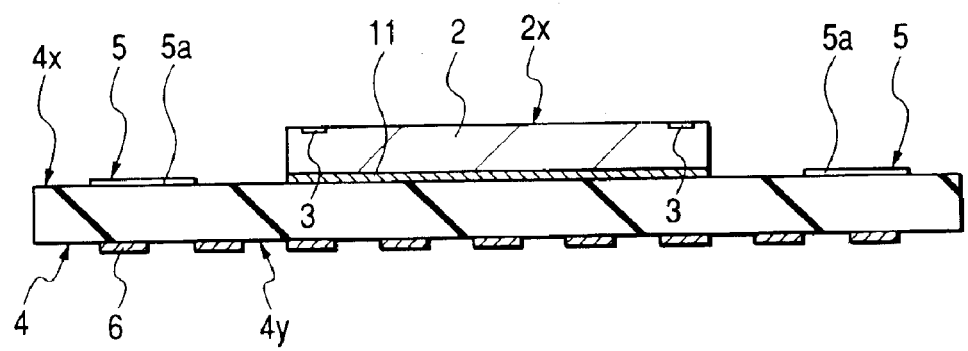

As illustrated in FIG. 6(a), the interposer 4 is first prepared. Thereafter, the semiconductor chip 2 is bonded and fixed to the main face 4x of the interposer 4 through the adhesive agent 11, as illustrated in FIG. 6(b).

Figure 6C:
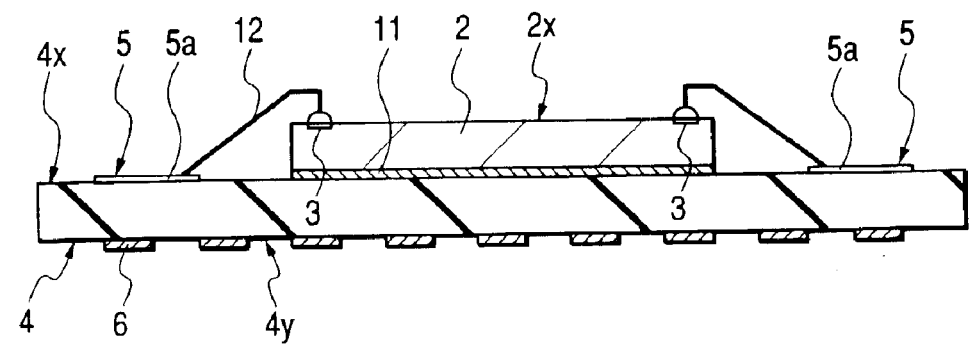
Figure 6D:
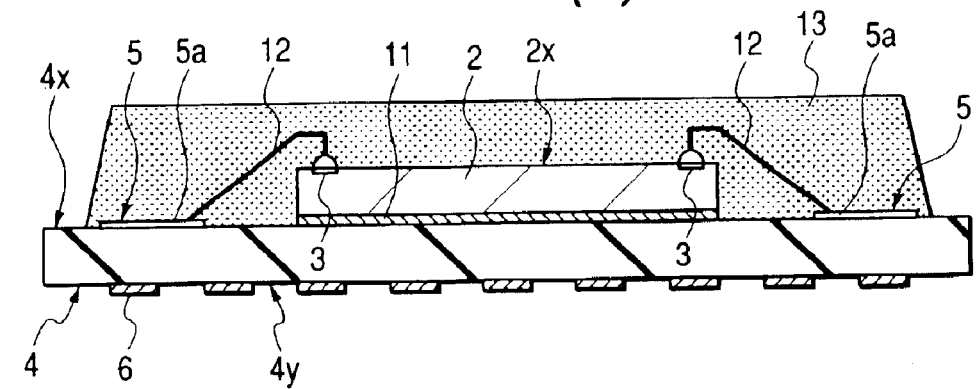

Next, the electrode pads 3 formed on the main face 2x of the semiconductor chip 2 are electrically connected to the electrode pads 5a formed on the main face 4x of the interposer 4 by means of the bonding wires 12, as illustrated in FIG. 6(c). Thereafter, the resin sealant 13 for sealing the semiconductor chip 2, the bonding wires 12 and so on is formed by a transfer molding method, as illustrated in FIG. 6(d).

Next, the solder bumps 14 are formed on the electrode pads 6 on the side of the rear face 4y of the interposer 4, thereby finishing the BGA type semiconductor device 1a of the present embodiment substantially. The formation of the solder bumps 14 may be according to various methods. Examples thereof include a formation method using solder balls, and a formation method using solder paste material.

The formation method using solder balls comprises forming a flux layer 15 on the electrode pads 6, as illustrated in FIG. 7(a); supplying solder balls 14a having a composition of Sn—Ag—Cu onto the electrode pads 6 by means of an absorbing member, as illustrated in FIG. 7(b); melting the solder balls 14a; and then hardening the solder. In this way, the solder bumps 14 are formed on the electrode pads 6, as illustrated in FIG. 7(c). The melting of the solder balls 14a is performed, for example, by transporting the interposer 4 into an infrared ray reflow furnace. In the step of melting the solder balls 14a, elements in the jointing layer 7 react with elements in the solder balls 14a, so that the alloy layer 9a containing these elements is formed. In the step of melting the solder balls 14a, the Au film 8 becomes extinct by diffusion.

The above-mentioned formation method using solder paste material comprises forming a solder paste layer 14b in which many solder particles having a composition of Sn—Ag—Cu are kneaded on the electrode pads 6 by screen printing, as illustrated in FIG. 8(a); melting the solder paste layer 14b; and then hardening the solder. In this way, the solder bumps 14 are formed on the electrode pads 6 by surface tension of the melted solder, as illustrated in FIG. 8(b). The melting of the solder paste layer 14b is performed, for example, by transporting the interposer 4 into an infrared ray reflow furnace. In the step of melting the solder paste layer 14b, elements in the jointing layer 7 react with elements in the solder paste layer 14b, so that the alloy layer 9a containing these elements is formed. In the step of melting the solder paste layer 14b, the Au film 8 becomes extinct by diffusion.

The solder bumps 14 may be formed by a method using solder balls and a solder paste layer besides the above-mentioned methods. This method, which is not illustrated, comprises forming a solder paste layer on the electrode pads 6 by screen printing; supplying solder balls onto the electrode pads 6 by means of an absorbing member; melting the solder paste layer; and hardening the solder. In this way, the solder bumps 14 are formed on the electrode pads 6.

Figure 9:
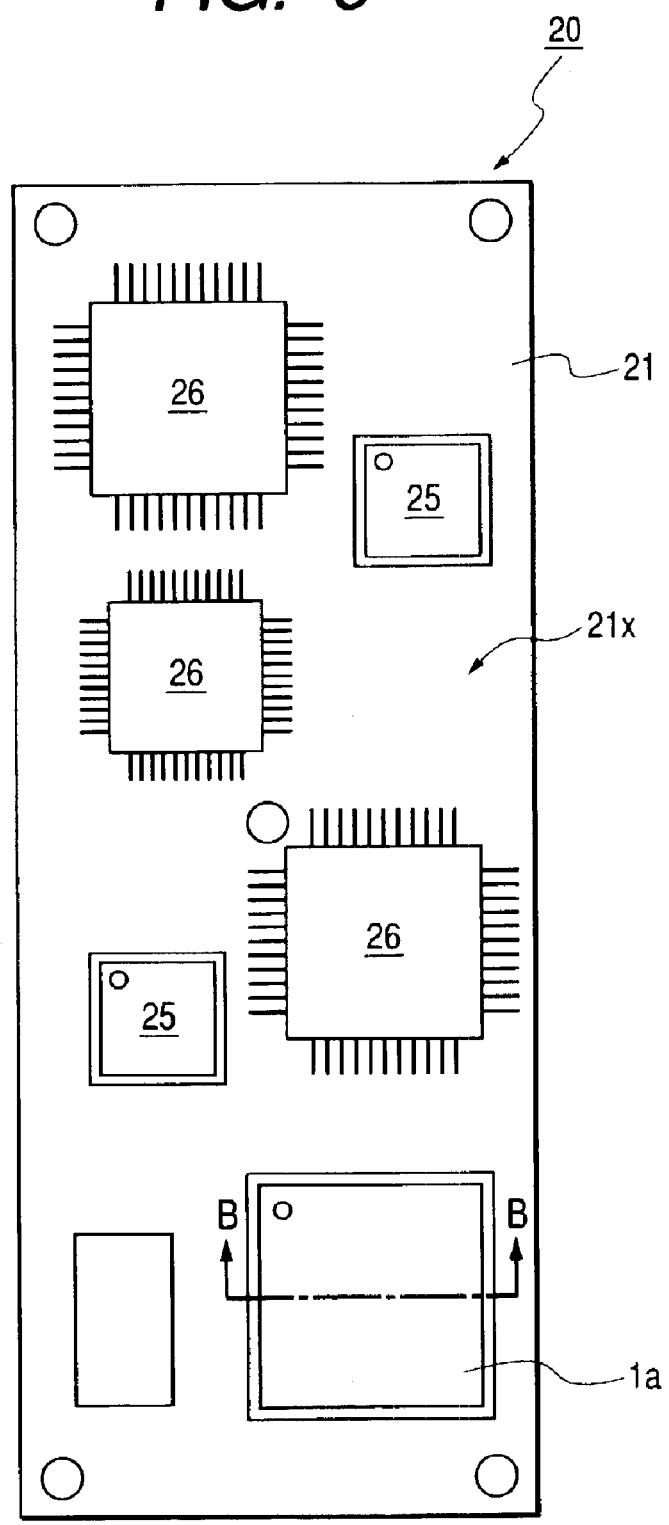
FIG. 9 is a plan view illustrating an outline of a module (electronic instrument) into which the BGA type semiconductor device according to the embodiment 1 of the present invention is integrated.
Figure 10:
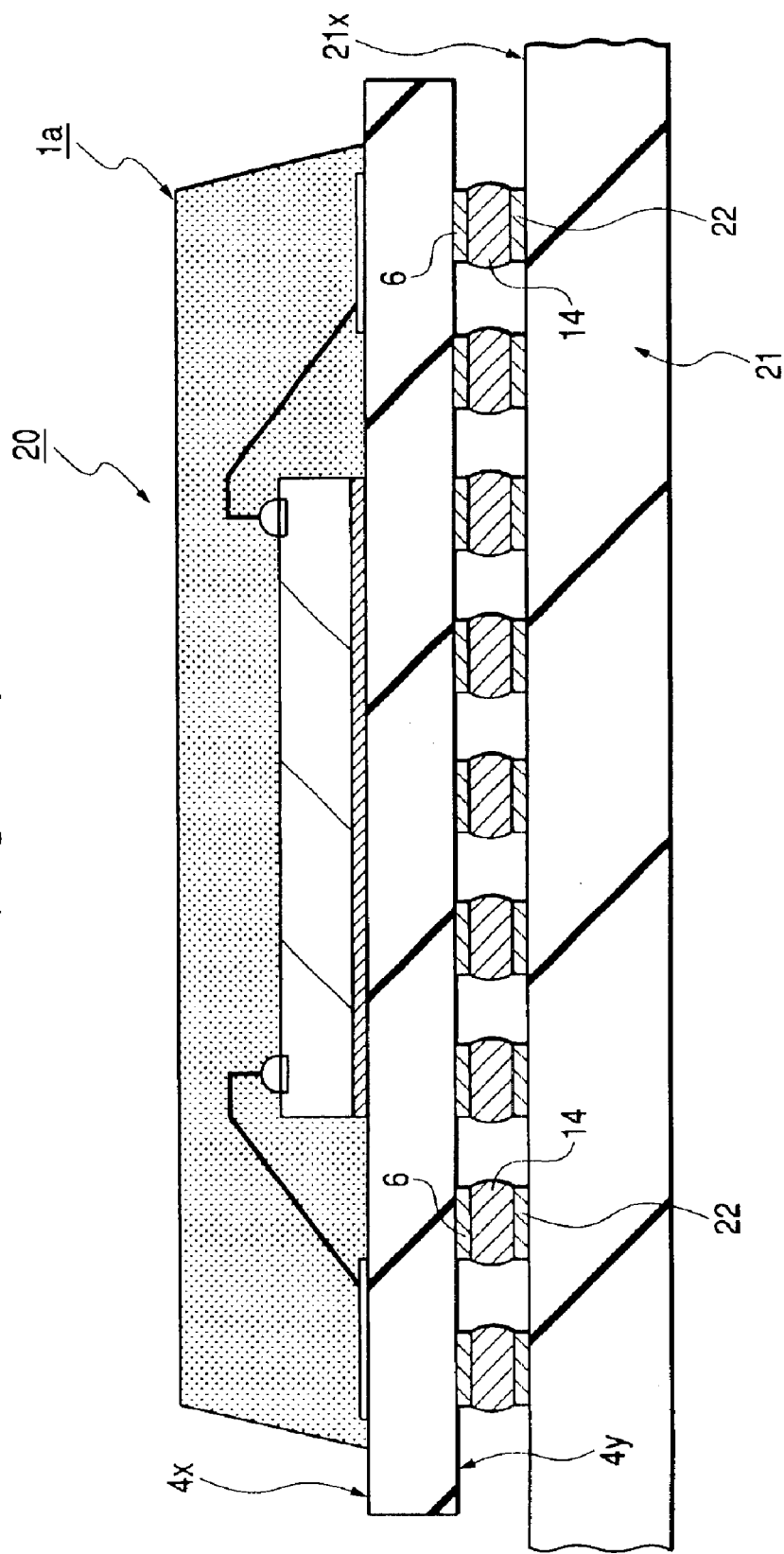
FIG. 10 is a sectional view taken along B—B line of FIG. 9.
Figure 11:
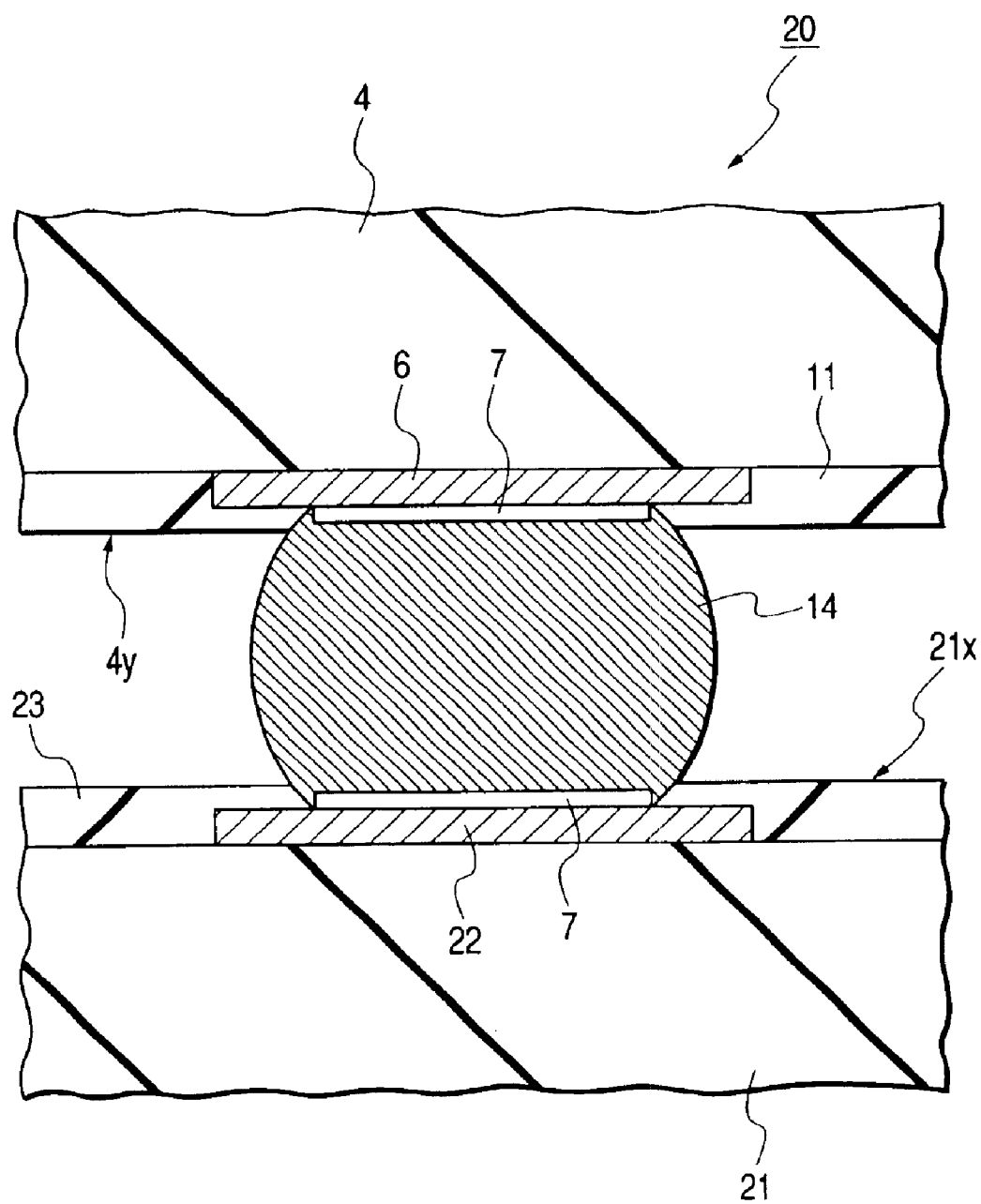
FIG. 11 is a partially enlarged sectional view of FIG. 10.
Figure 12:
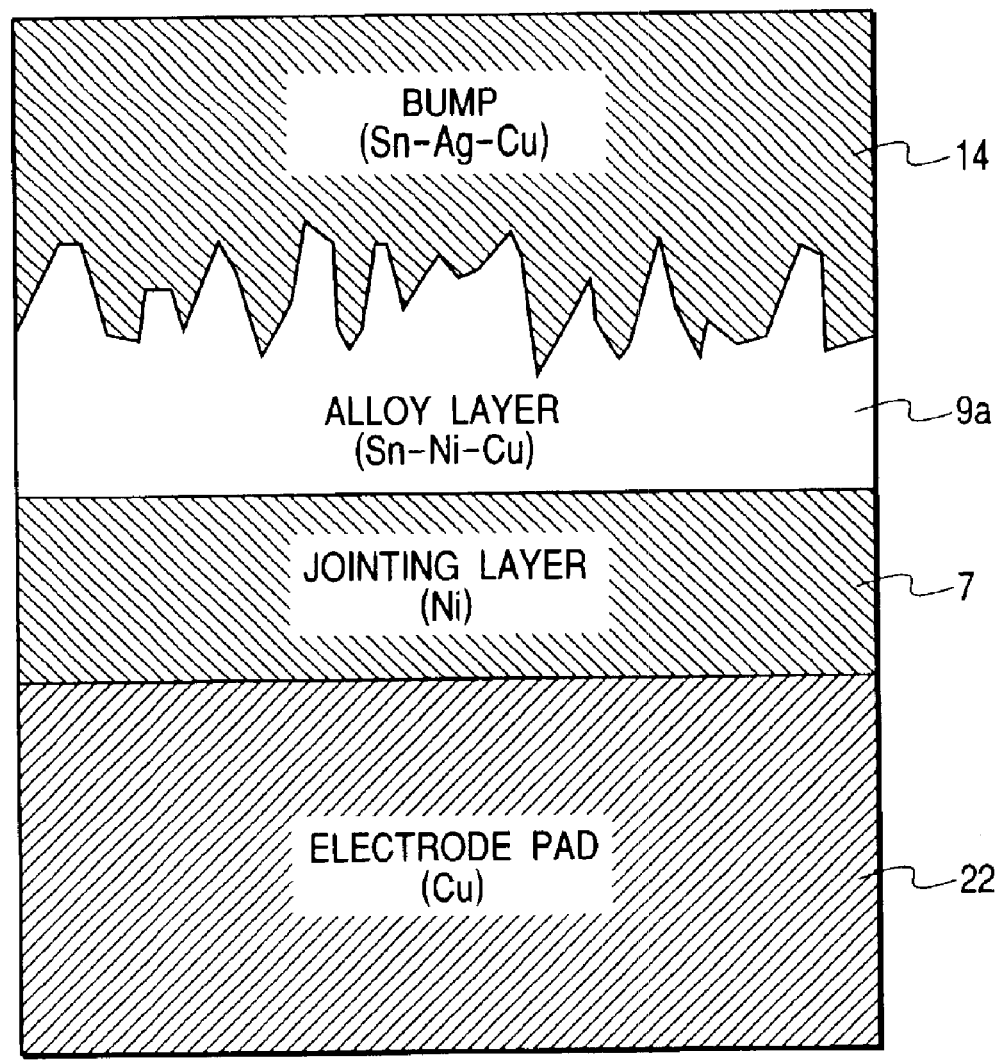
FIG. 12 is a partially enlarged sectional view of FIG. 11.
Figure 13A:
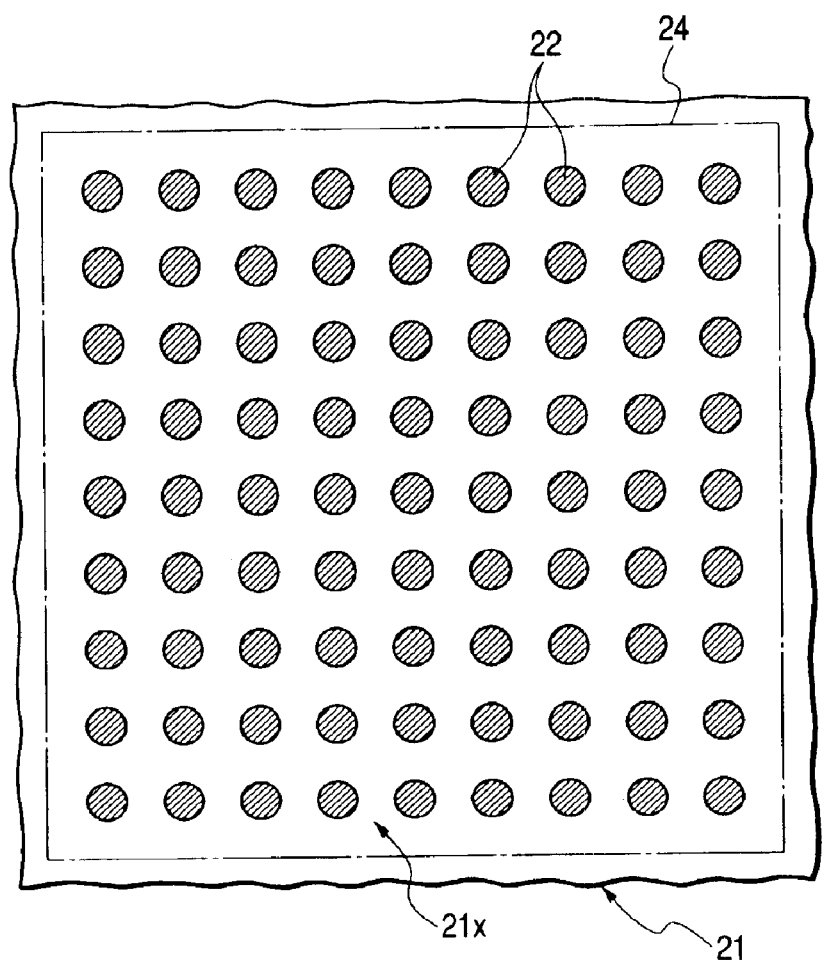
FIGS. 13(a) and 13(b) are views illustrating an outline of a mount board used in the manufacture of the module illustrated in FIG. 9 (FIG. 13(a) is a plan view thereof, and FIG. 13(b) is a sectional view thereof).
Figure 13B:
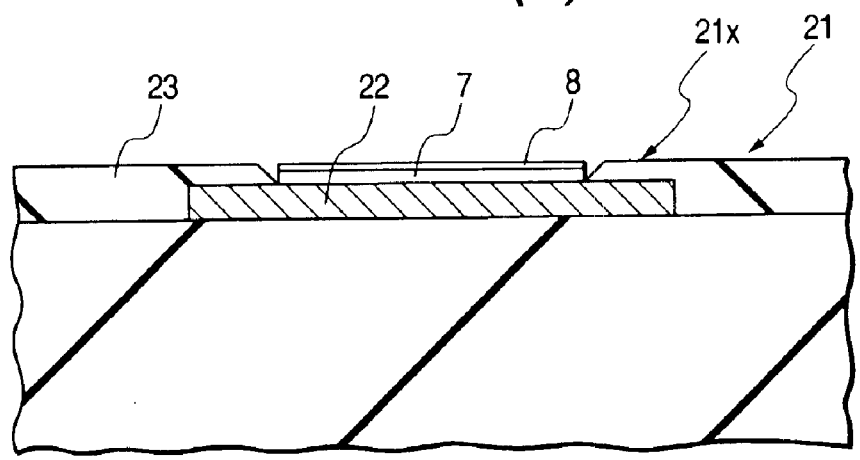
Figure 14:
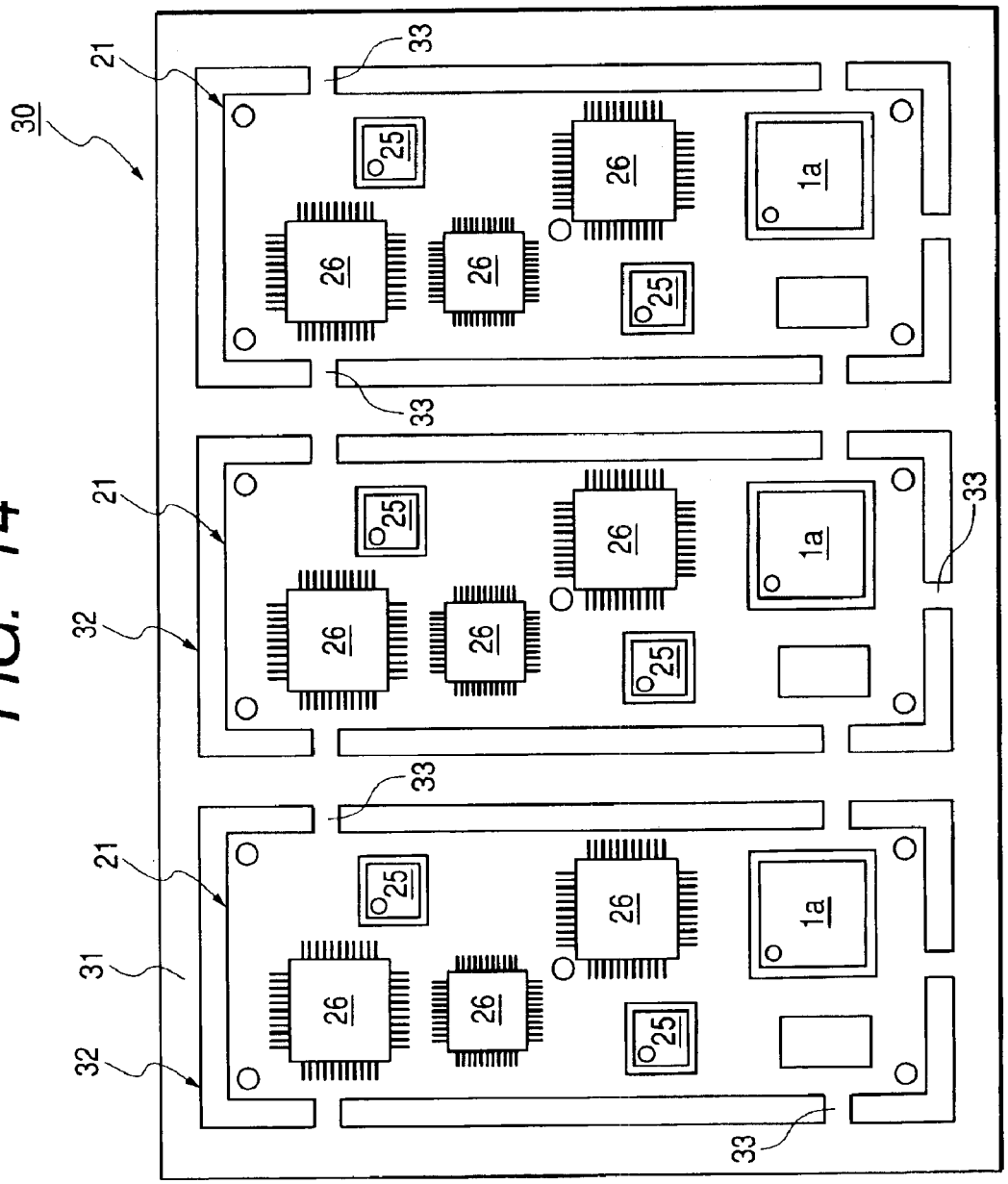
FIG. 14 is a plan view illustrating an outline of a multiboard-yielding panel comprising the mound board illustrated in FIG. 13.
Figure 15A:
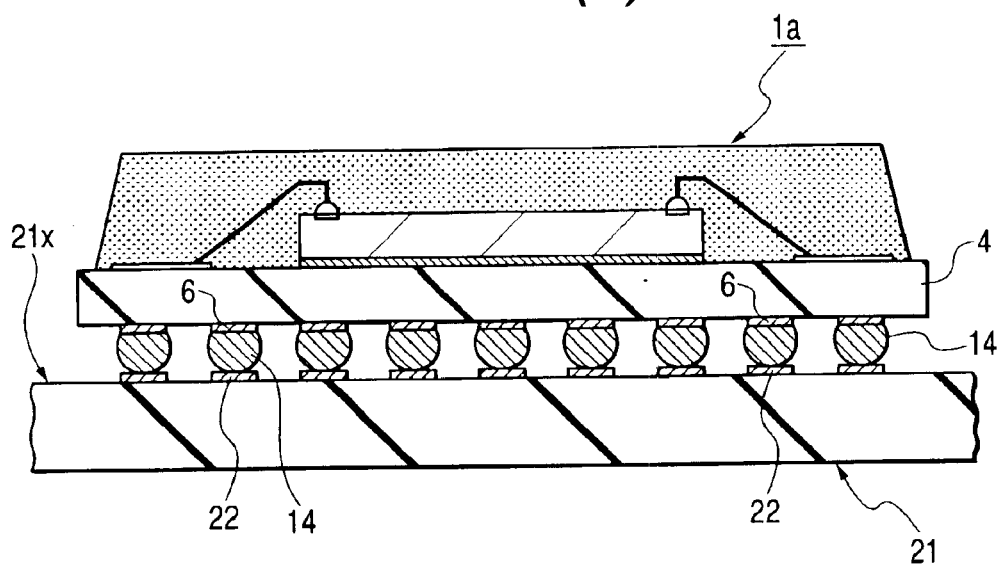
FIGS. 15(a) and 15(b) are view for explaining the manufacture of the module illustrated in FIG. 9 (FIGS. 15(a) and 15(b) are sectional views of respective steps thereof).
Figure 15B:
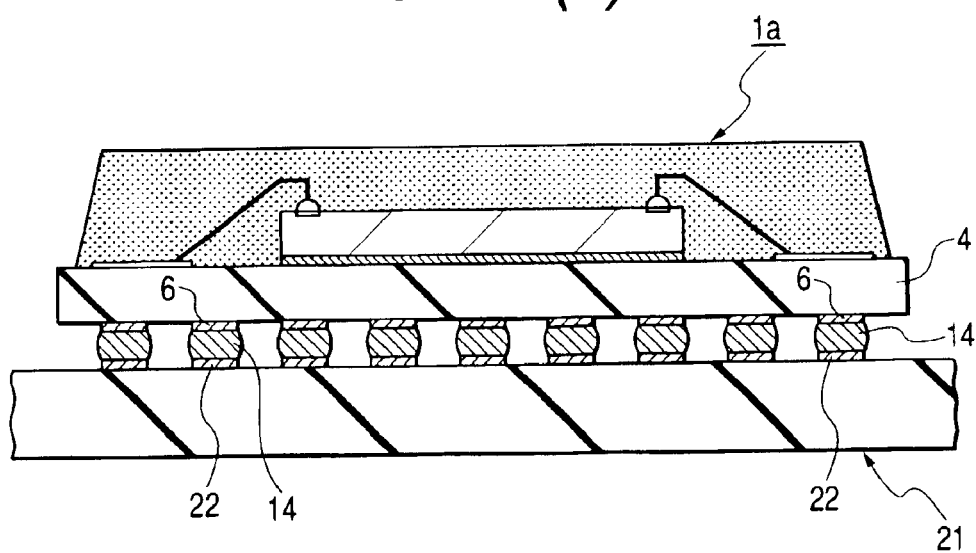

FIG. 9 is a plan view illustrating an outline of a module (electronic instrument) into which the BGA type semiconductor device 1a is integrated, FIG. 10 is a sectional view taken along B—B line of FIG. 9, FIG. 11 is a partially enlarged sectional view of FIG. 10, FIG. 12 is a partially enlarged sectional view of FIG. 11, FIGS. 13(a) and 13(b) are views illustrating an outline of a mount board used in the manufacture of the module illustrated in FIG. 9 (FIG. 13(a) is a plan view thereof, and FIG. 13(b) is a sectional view thereof), FIG. 14 is a plan view illustrating an outline of a multiboard-yielding panel comprising the mound board illustrated in FIG. 13, and FIGS. 15(a) and 15(b) are views for explaining the manufacture of the module illustrated in FIG. 9 (FIGS. 15(a) and 15(b) are sectional views of respective steps thereof).

As illustrated in FIG. 9, a module 20 has a structure wherein the BGA type semiconductor device 1a, BGA type semiconductor devices 25 and QFP (quad flatpack package) type semiconductor devices 26 are mounted, as electronic members, on the side of a main face 21x of a mount board 21.

The mount board 21 is not limited to this example, and has a structure composed mainly of a core material, a protective film (reference number 23 in FIG. 11) formed to cover the main face of this material, and a protective film formed to cover the rear face opposite to the main face of this core material (the face positioned on the side opposite to the main face of the core material). The core material has, for example, a multilayered wiring structure having wires on two faces (i.e., the surface and the rear face) thereof. Each of the insulating layers which constitute the core material is made of, for example, a high-elasticity resin substrate wherein glass fiber is impregnated with epoxy resin or polyimide resin. Each of the wiring layers which constitute the core material is made of, for example, a metal film which mainly comprises Cu. The protective film (23) on the main face of the core material is formed mainly to protect wires formed on the uppermost wiring layer of the core material, and the protective film on the rear face of the core material is formed mainly to protect wires formed on the lowermost wiring layer of the core material. The protective films on the main face and the rear face of the core material are made from, for example, two-liquid alkali developer type solder resist ink or one-liquid thermosetting type solder resist ink.

As illustrated in FIG. 13(a), in the main face 21x of the mount board 21, plural electrode pads 22 are formed in a member-mounting area 24 where the BGA type semiconductor device 1a is mounted. The electrode pads 22 are arranged in an array form, correspondingly to the terminals (solder bumps 14), for external connection, of the BGA type semiconductor device 1a. Plural electrode pads, which are not illustrated, are also arranged in member-mounting areas where the BGA type semiconductor devices 25 are mounted, correspondingly to terminals (solder bumps), for external connection, of the BGA type semiconductor devices 25. Plural electrode pads, which are not illustrated, are also arranged in member-mounting areas where the QFP type semiconductor devices 26 are mounted, correspondingly to terminals (tips of leads projected from the side face of the sealant), for external connection, of the QFP type semiconductor devices 26. Each of these electrode pads is made of a part of each of plural wires formed on the uppermost wiring layer of the core material, and is exposed from an opening made in the protective film (23) on the main face of the core material.

As illustrated in FIG. 11, the solder bumps 14 are interposed between the electrode pads 6 of the BGA type semiconductor device 1a and the electrode pads 22 of the mount board 21, are fixed and bounded to the electrode pads 6 and 22, and are electrically and mechanically connected thereto.

A jointing layer 7 is formed on the surface of the electrode pads 22 of the mount board 21 in order to make the bondability between the electrode pads 22 and the solder bumps 14 high. In the present embodiment, the jointing layer 7 is made of a Ni plating layer which is made mainly of Ni and does not contain sulfur substantially.

As illustrated in FIG. 12, between the jointing layer 7 on the electrode pads 22 and the solder bumps 14 is formed an alloy layer (intermetallic compound layer) 9a having a composition of Sn—Ni—Cu, which contains elements of these layers. By joint between the jointing layer 7 and the solder bumps 14 through this alloy layer 9a, the electrode pads 22 are fixed and bonded to the solder bumps 14.

In other words, the module 20 of the present embodiment has a joint structure wherein between the electrode pads (underlying conductive layer) 6 of the BGA type semiconductor device (electronic member) 1a and the electrode pads (underlying conductive layer) 22 of the mount board (wiring board) 21 are interposed the solder bumps (lead-free solder layer) 14 having the Pb-free composition; between the electrode pads (underlying conductive layer) 22 of the mount board 21 and the solder bumps (lead-free solder layer) 14 having the Pb-free composition is interposed the jointing layer 7 which does not contain sulfur substantially; and between the jointing layer 7 and the Pb-free solder bumps (lead-free solder layer) 14 is formed the alloy layer 9a containing elements of these layers.

The module 20 of the present embodiment has a joint structure wherein between the electrode pads (underlying conductive layer) 6 of the BGA type semiconductor device (electronic member) 1a and the electrode pads (underlying conductive layer) 22 of the mount board (wiring board) 21 are interposed the solder bumps (lead-free solder layer) 14 having the Pb-free composition; between the electrode pads (underlying conductive layer) 6 of the BGA type semiconductor device 1a and the solder bumps (lead-free solder layer) 14 having the Pb-free composition is interposed the jointing layer 7 which does not contain sulfur substantially; and between the jointing layer 7 and the solder bumps (lead-free solder layer) 14 having the Pb-free composition is formed the alloy layer 9a containing elements of these layers.

At the stage before the solder bumps 14 are formed on the electrode pads 22, a Au (gold) film 8, which is made of, for example, a plating layer, is formed as an antioxidation film on the surface of the jointing layer 7, as illustrated in FIG. 13(b). Since this Au film 8 is generally made to have a small film thickness of about 1 $\mu$m, the film 8 becomes extinct by diffusion at the time of the formation of the solder bumps 14 (at the time of mounting the BGA type semiconductor device 1a).

The module 20 is manufactured using a multiboard-yielding panel (large-number yielding panel) 30 in order to make the productivity high. As illustrated in FIG. 14, the multiboard-yielding panel 30 has a structure wherein plural product-forming areas 32, which are partitioned by frames 31, are arranged in one direction. In each of the product-forming areas 32, the mount board 21 is arranged, and the mount board 21 is integrated with the frame 31 through connecting portions 33.

The following will describe the manufacture of the module, referring to FIGS. 14 and 15.

The multiboard-yielding panel 30 illustrated in FIG. 14 is first prepared. Thereafter, electronic members, including the BGA type semiconductor devices 1a and 25, and the QFP type semiconductor devices 26, are collectively mounted on the main face 21x of each of the mount boards 21 by a reflow method. The mounting of the BGA type semiconductor device 1a is performed by forming a flux layer on the electrode pads 22 arranged in the member-mounting area 24 of the main face 21x of the mount board 21 by screen printing, arranging the BGA type semiconductor device 1a on the member-mounting area 24 so that the semiconductor bumps 14 are positioned on the electrode pads 22, transporting the multiboard-yielding panel 30, for example, to an infrared ray reflow furnace to melt the solder bumps 14 as illustrated in FIG. 15(b), and then hardening the melted solder bumps 14. In this step of mounting the BGA type semiconductor device 1a, elements in the jointing layer 7 in the mount board 21 react with elements in the melted solder, so that the alloy layer 9a containing these elements is formed, as illustrated in FIG. 12. In the step of mounting the BGA type semiconductor device 1a, the Au film 8 becomes extinct by diffusion.

Next, the connecting portions 33 of the multiboard-yielding panel 30 illustrated in FIG. 14 are cut so as to cut off the mount board 21 from the frame 31, thereby completing the module 20 illustrated in FIG. 9 substantially. Examples of the method for cutting the connecting portions 33 include a method of moving an upper edge from above the main face of the multiboard-yielding panel 30 toward the multiboard-yielding panel 30 and moving a lower edge from above the rear face opposite to the main face of the multiboard-yielding panel 30 toward the multiboard-yielding panel 30 so as to cut the connection portions 33 by shearing effect; and a method of moving an edge from above either one of the main face and the rear face of the multiboard-yielding panel 30 toward the multiboard-yielding panel 30 so as to cut the connecting portions 33 by shearing effect. The method for cutting off the mount board 21 may be a method of cutting the connecting portions 33 by a cutting tool besides the method of cutting the connecting portions 33 by the shearing effect based on the movement of the cutting edge.

Figure 16:
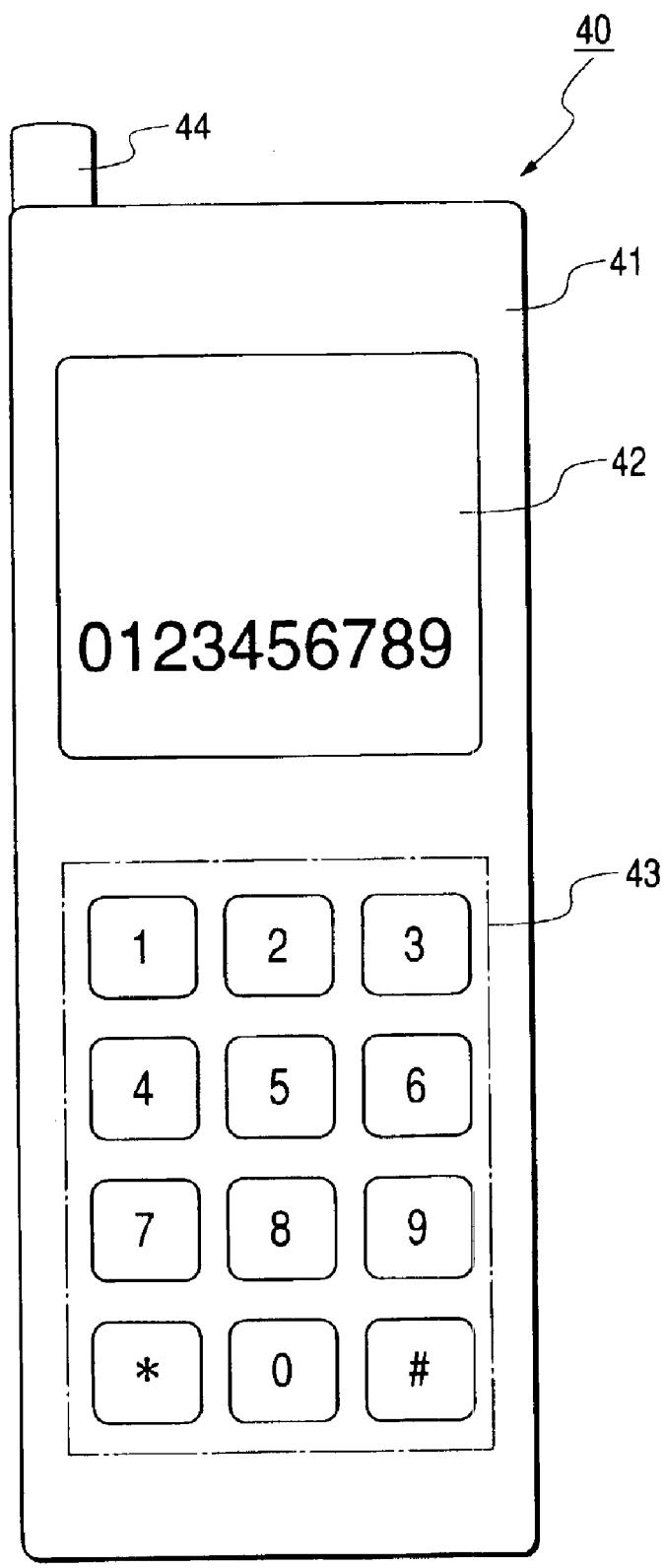
FIG. 16 is a plan view illustrating an outline of a portable telephone (portable electronic instrument) into which the module illustrated in FIG. 9 is integrated.

FIG. 16 is a plane view illustrating an outline of a portable telephone (portable electronic instrument) into which the module 20 is integrated.

As illustrated in FIG. 16, the portable telephone 40 has a case (case body) 41, a display section 42, a key operation section 43, an antenna 44, and so on. The case 41 is composed of a front case and a rear face. A liquid crystal display device, the module 20 and so on are integrated into this case 41.

Figure 17:
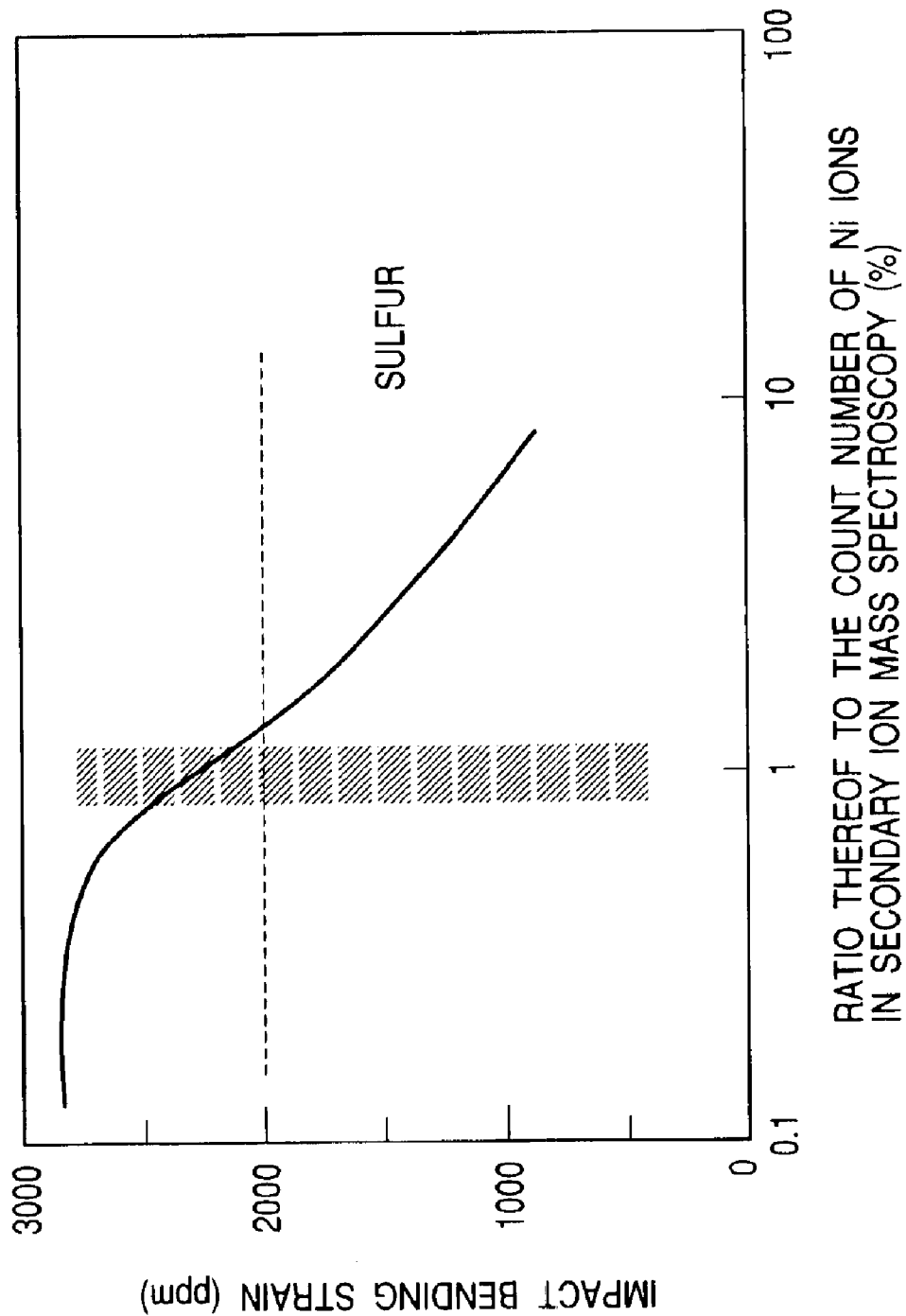
FIG. 17 is a characteristic graph showing a relationship between the sulfur concentration in a jointing layer and the impact strength resistance of a solder joint portion.
Figure 18:
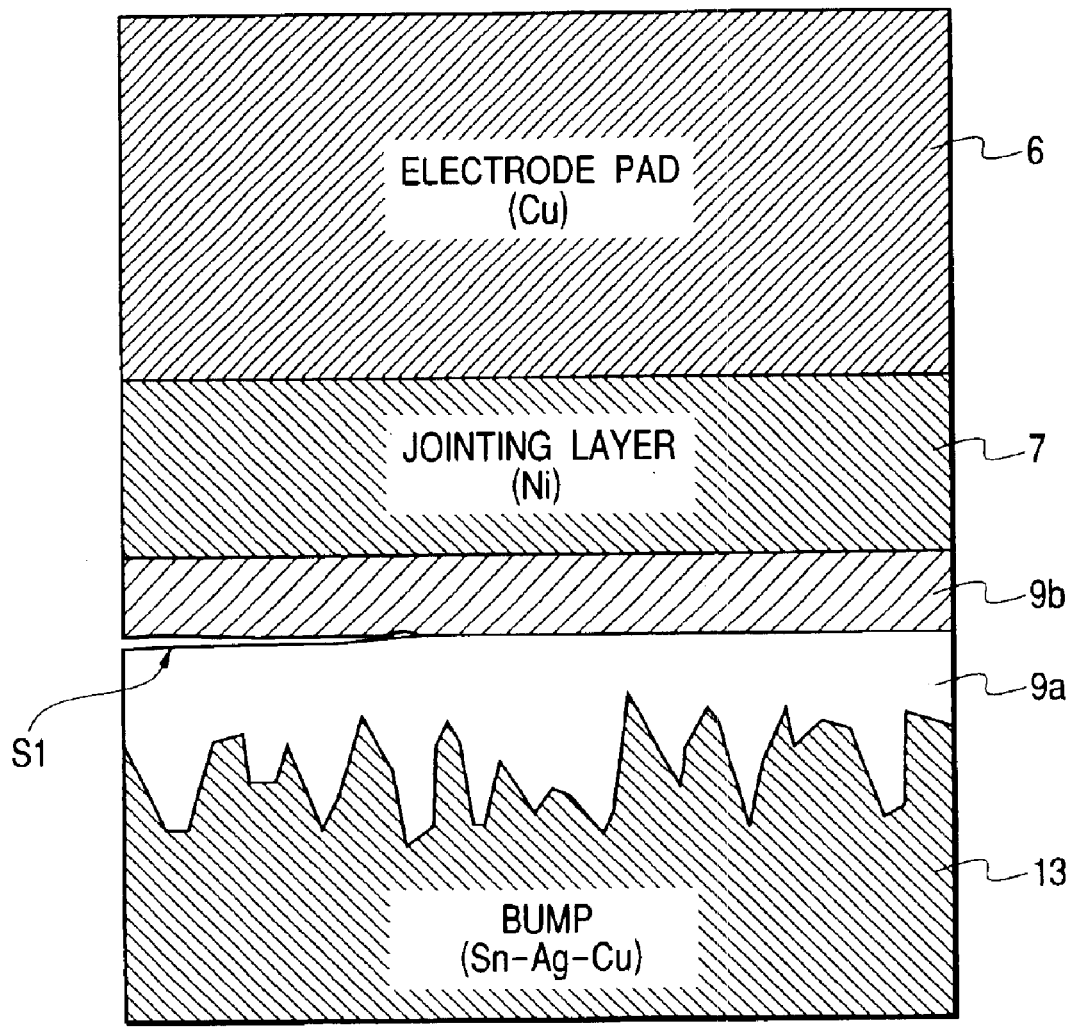
FIG. 18 is a partial sectional view of the solder joint portion in the case that the sulfur concentration in the jointing layer is high.
Figure 19:
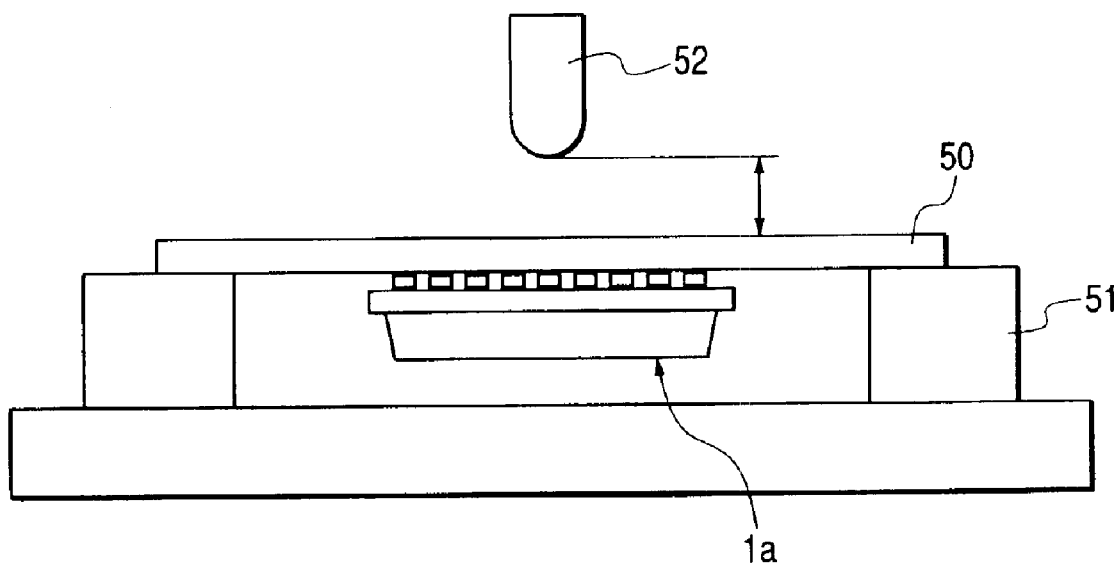
FIG. 19 is a view for explaining impact resistance evaluation.
Figure 20:
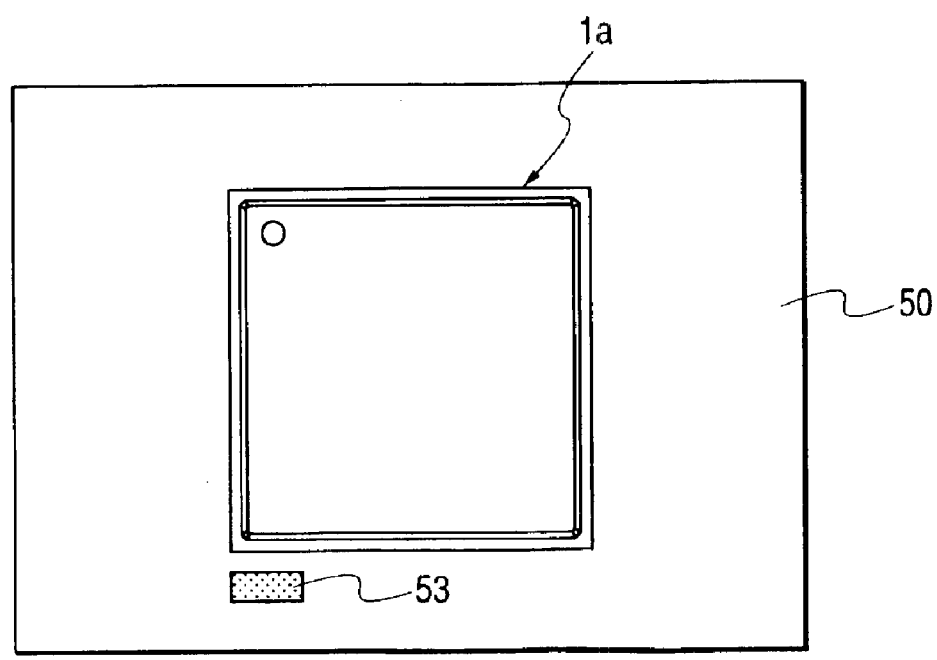
FIG. 20 is a view for explaining impact resistance evaluation.

The following will describe the impact strength resistance of a solder joint portion as described above. FIG. 17 is a graph showing a relationship between the concentration of sulfur in a jointing layer and the impact strength resistance. FIG. 18 is a partially sectional view of a solder joint portion in the case that the concentration of sulfur in the jointing layer is high. FIGS. 19 and 20 are views for explaining the method of evaluating impact strength resistance.

As illustrated in FIGS. 19 and 20, a sample wherein the BGA type semiconductor device 1a was mounted on the main face of the mount board 50 was formed, and impact was applied to this sample so as to evaluate the impact strength resistance of solder joint portions thereof. The site to be evaluated was one of the solder joint portions in the electrode pads 6 of the interposer 4. In order to apply the impact to the sample, a probe 52 was dropped from above the rear face opposite to the main face of the mount board 50 to the rear face of the mount board 50 in the state that the sample was put on a frame-like stand. In order to measure the impact quantitatively, impact bending strain generated in the mount board 50 by the drop of the probe 52 was measured by means of a strain gauge attached onto the main face of the mount board 50.

In FIG. 17, the sulfur concentration in the jointing layer is represented by the ratio of the count number of sulfur ions to the count number of jointing layer ions in secondary ion mass spectrometry (SIMS). The data in the figure are data when the solder joint portion was cracked. The secondary ion mass spectrometry was performed at an accelerating voltage of 14 kV and a vacuum degree of $5\times10^{-7}$ Pa, using $Cs^+$ as a primary ion. In the case that the area to be measured was 300 µm or more, the spectrometry was performed under the following conditions: a current of 25 nA, a beam diameter of 60 µm, an etching area of 200 µm×200 µm, and a data collecting area of 70 µm×70 µm. In the case that the area to be measured was less than 300 µm, the spectrometry was performed under the following conditions: a current of 5 nA, a beam diameter of 20 µm, an etching area of 200 µm×200 µm, and a data collecting area of 40 µm×40 µm.

As illustrated in FIG. 17, as the sulfur concentration in the jointing layer is lower, the impact strength resistance of the joint portion becomes higher. Therefore, by using the jointing layer 7 which does not contain sulfur substantially, the impact strength resistance of the solder joint portion in the electrode pad 6 of the interposer 4 can be improved.

As illustrated in FIG. 18, in the case that the sulfur concentration in the jointing layer is high, two alloy layers (9a, and 9b) are formed between the solder bumps 14 and the jointing layer 7 and a crack S1 is generated in the interface between the alloy layers 9a and 9b. The alloy layers 9a and 9b have the same alloy composition (Sn—Ni—Cu) but are in different crystal states. The alloy layer 9b formed on the side of the jointing layer 7 is made of granular crystal. Since the crack S1 is generated in the interface between the alloy layer 9b, which is made of granular crystal, and the alloy layer 9a, it is presumed that the adherence strength based on this interface is low.

The generation of the alloy layer 9b made of granular crystal starts from the vicinity of a point where the sulfur concentration exceeds 1% as the ratio of the sulfur ion number to the count number of the jointing layer ions in the secondary ion mass spectrometry. Accordingly, If the sulfur concentration is 1% or less, the alloy layer 9b made of granular crystal is not generated; therefore, even if the solder bumps 14 having the Pb-free composition are used, the impact strength resistance of the solder joint portion in the electrode pad 6 of the interposer 4 can be improved.

As illustrated in FIG. 17, the crack of the solder joint portion starts from the vicinity of the point where the sulfur concentration exceeds 1% by a strain of 2000 ppm or less. The impact bending strain generated in the mount board when the portable telephone is dropped from such a level that the telephone is used with the telephone close to user's ear is at largest about 2000 ppm. Accordingly, if the sulfur concentration in the jointing layer 7 is 1% or less, the solder joint portion is not cracked even if the portable telephone is dropped in ordinary using environment. It is therefore possible to ensure the reliability, against impact, of the portable telephone 40 into which the module 20, wherein the solder bumps 14 having the Pb-free composition are used to mount the BGA type semiconductor device 1a on the mount board, is integrated.

The jointing layer 7 made of the Ni plating layer is formed by electroplating using a plating solution. As the plating solution, there is generally used a plating solution wherein a nickel chloride (NiCl) solution is mixed with a nickel sulfate (NiSO$_4$) solution. Sulfur may be added to this plating in order to make the surface of the jointing layer 7 smooth and make the Au film formed on the jointing layer 7 glossy. Accordingly, in order to lower the sulfur concentration in the jointing layer 7, it is desired not to add sulfur as a glossing agent to the plating solution.

The surface and the rear face of the interposer 4 are covered with protective films made of resin material. Sulfur contained in the protective films elutes in the plating solution when the jointing layer 7 is formed. Accordingly, in order to lower the sulfur concentration in the jointing layer 7, it is important to control the plating solution.

The production of the module 20 comprises the step of mounting the BGA type semiconductor device 1a onto the mount board 21, cutting the connecting portions 33 of the multiboard-yielding panel 30, and then cutting off the mount board 21 from the frame 31. In the case that the connecting portions 33 are cut by shearing effect based on the movement of a cutting edge at this time, impact bending strain is applied to the mount board 21. Thus, the solder joint portions are cracked when the impact strength resistance of the solder joint portions is low. However, by making the jointing layer 7 on the electrode pads 6 to a layer which does not contain sulfur substantially, the impact strength resistance of the solder joint portions in the electrode pads 6 can be improved. Therefore, in the step of cutting off the mount board 21 from the frame 31, the solder joint portions in the electrode pads 6 can be prevented from being cracked. As a result, it is possible to improve the production yield of the module 20 wherein the solder bumps 14 having the Pb-free composition are used to mount the BGA type semiconductor device 1a on the mount board.

In the module 20 wherein the BGA type semiconductor device 1a is mounted, the jointing layer 7 is also disposed on the electrode pads 22 of the mount board 21. Accordingly, by making the jointing layer 7 on the electrode pads 22 in the mount board 21 to a layer which does not contain sulfur substantially, the impact strength resistance of the solder joint portions in the electrode pads 22 of the mount board 21 can be improved even if the solder bumps 14 having the Pb-free composition are used. Since the impact strength resistance of the solder joint portions in the electrode pads 22 can be improved, it is possible to improve the production yield of the module 20 wherein the solder bumps 14 having the Pb-free composition are used to mount the BGA type semiconductor device 1a on the mount board 21. It is also possible to ensure the reliability, against impact, of the portable telephone 40 into which this module 20 is integrated.

Figure 21:
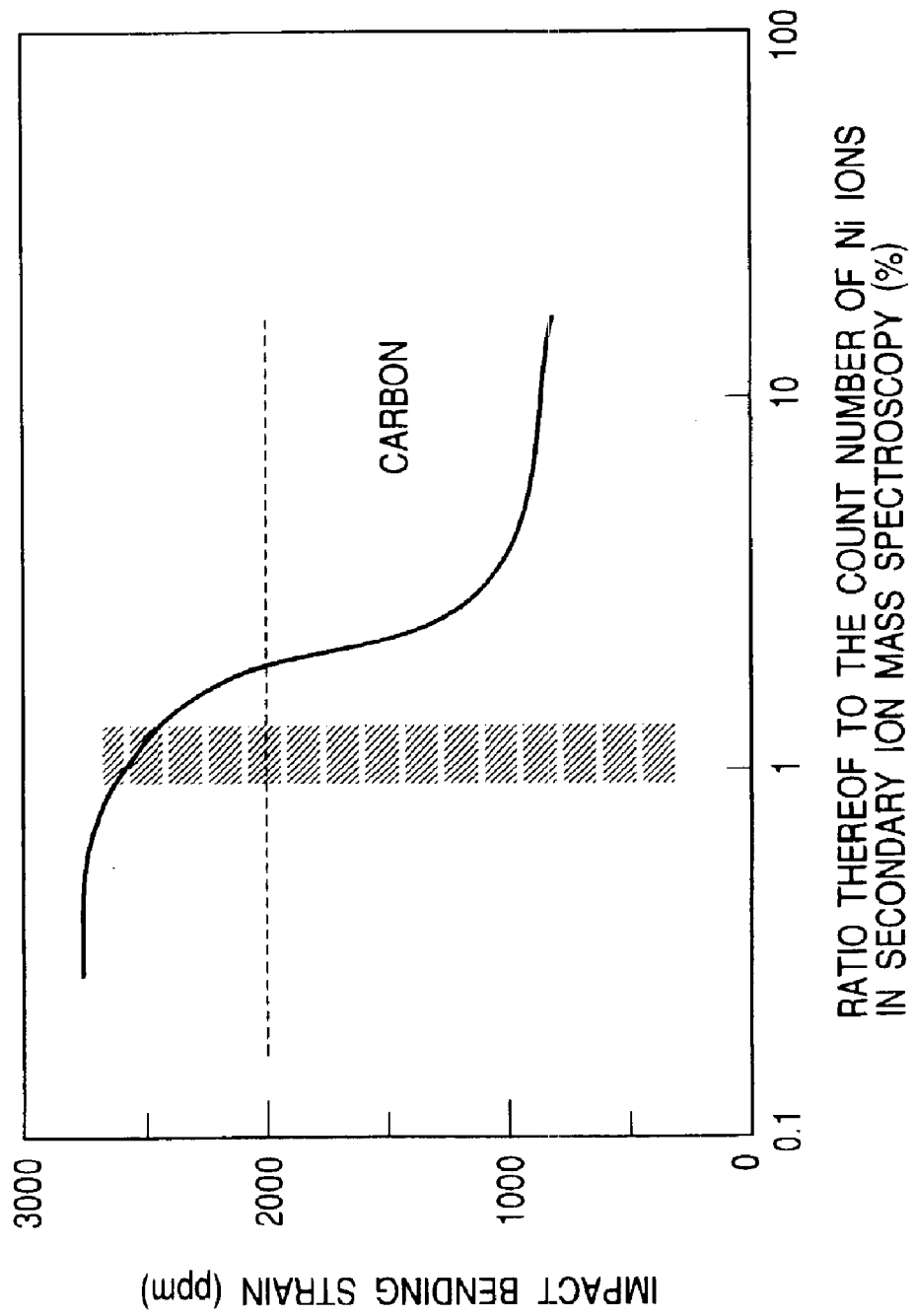
FIG. 21 is a characteristic graph showing a relationship between the carbon concentration in the jointing layer and the impact strength resistance of the solder joint portion.
Figure 22:
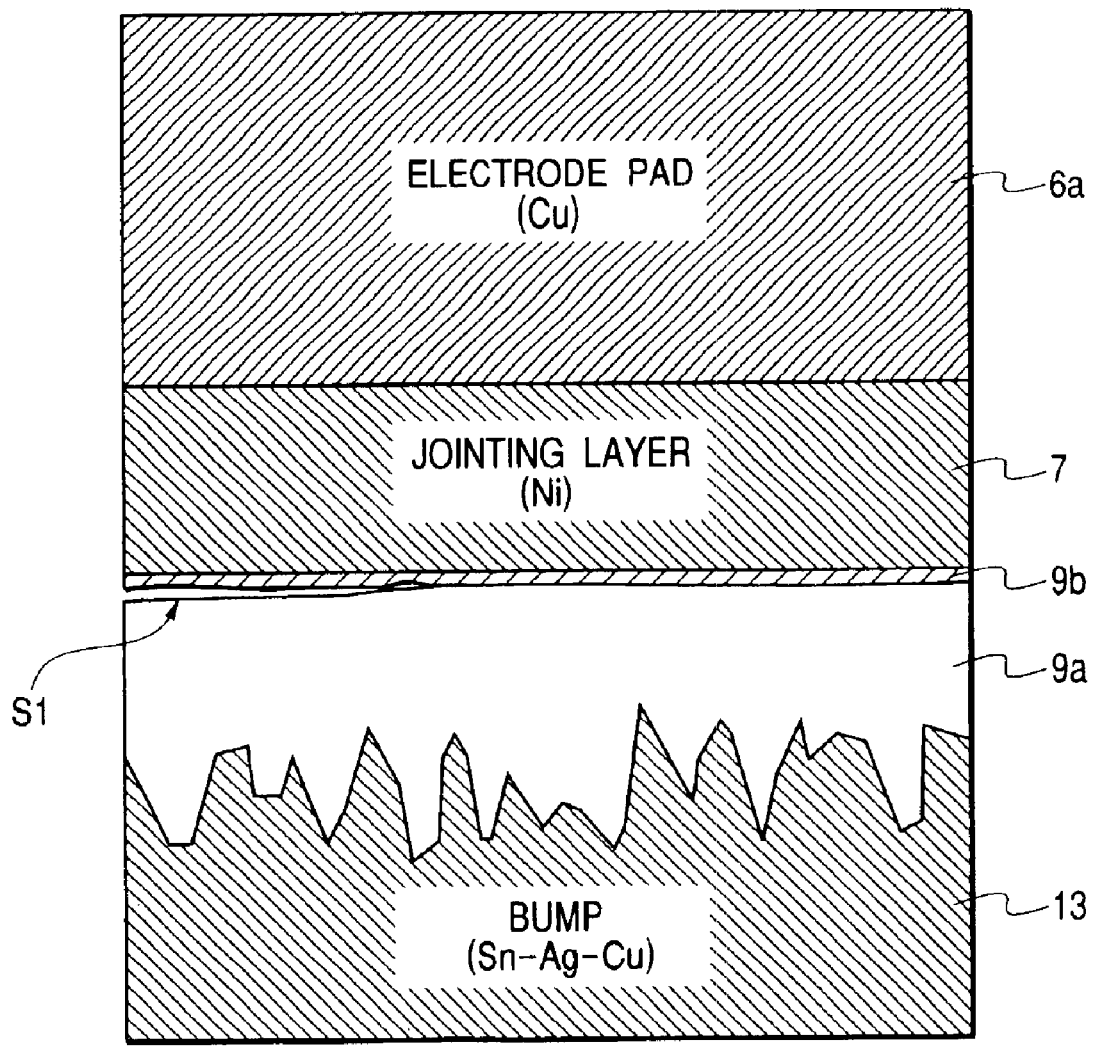
FIG. 22 is a partial sectional view of a solder joint portion in the case that the carbon concentration in a jointing layer is high.

FIG. 21 is a graph showing a relationship between the carbon concentration in a jointing layer and the impact strength resistance, and FIG. 22 is a partially sectional view of a solder joint portion in the case that the carbon concentration in the jointing layer is high. Evaluation about the carbon concentration is made under the same conditions as in the evaluation about the sulfur concentration.

As illustrated in FIG. 21, the impact strength resistance of the solder joint portion becomes higher as the carbon concentration in the jointing layer 7 becomes lower. Accordingly, by making the jointing layer 7 to a layer which does not contain carbon substantially, the impact strength resistance of the solder joint portion in the electrode pad 6 of the interposer 4 can be improved even if the solder bumps 14 having the Pb-free composition are used.

As illustrated in FIG. 22, in the case that the carbon concentration in the jointing layer is high, two alloy layers (9a, and 9b) are formed between the solder bumps 14 and the jointing layer 7 and a crack S1 is generated in the interface between the alloy layers 9a and 9b. The alloy layers 9a and 9b have the same alloy composition (Sn—Ni—Cu) but are in different crystal states. However, the alloy layer 9b formed on the side of the jointing layer 7 is not made of granular crystal, which is different from the case of sulfur. Since the crack S1 is generated in the interface between the alloy layers 9b and 9a in this way, it is presumed that the adherence strength based on this interface is low.

The generation of the alloy layer 9b starts from the vicinity of a point where the carbon concentration exceeds 1% as the ratio of the carbon ion number to the count number of the jointing layer ions in the secondary ion mass spectrometry. Accordingly, if the carbon concentration is 1% or less, the alloy layer 9b is not generated; therefore, even if the solder bumps 14 having the Pb-free composition are used, the impact strength resistance of the solder joint portions in the electrode pads 6 of the interposer 4 can be improved.

Since the impact strength resistance of the solder joint portions in the electrode pads 6 of the interposer 4 can be improved, it is possible to improve the production yield of the module 20 wherein the solder bumps 14 having the Pb-free composition are used to mount the BGA type semiconductor device 1a on the mount board 21.

As illustrated in FIG. 21, the crack of the solder joint portion starts from the vicinity of the point where the carbon concentration exceeds 1% by a strain of 2000 ppm or less. Accordingly, if the carbon concentration in the jointing layer is 1% or less, the solder joint portion in the electrode pad 6 is not cracked even if the portable telephone is dropped in ordinary using environment. It is therefore possible to ensure the reliability, against impact, of the portable telephone 40 into which the module 20, wherein the solder bumps 14 having the Pb-free composition are used to mount the BGA type semiconductor device 1a on the mount board 21, is integrated.

In the module 20 wherein the BGA type semiconductor device 1a is mounted, the jointing layer 7 is also disposed on the electrode pads 22 of the mount board 21. Accordingly, by making the jointing layer 7 on the electrode pads 22 to a layer which does not contain carbon substantially, the impact strength resistance of the solder joint portions in the electrode pads 22 of the mount board 21 can be improved even if the solder bumps 14 having the Pb-free composition are used.

Since the impact strength resistance of the solder joint portions in the electrode pads 22 of the mount board 21 can be improved, it is possible to improve the production yield of the module 20 wherein the solder bumps 14 having the Pb-free composition are used to mount the BGA type semiconductor device 1a on the mount board 21. It is also possible to ensure the reliability, against impact, of the portable telephone 40 into which this module 20 is integrated.

Figure 23:
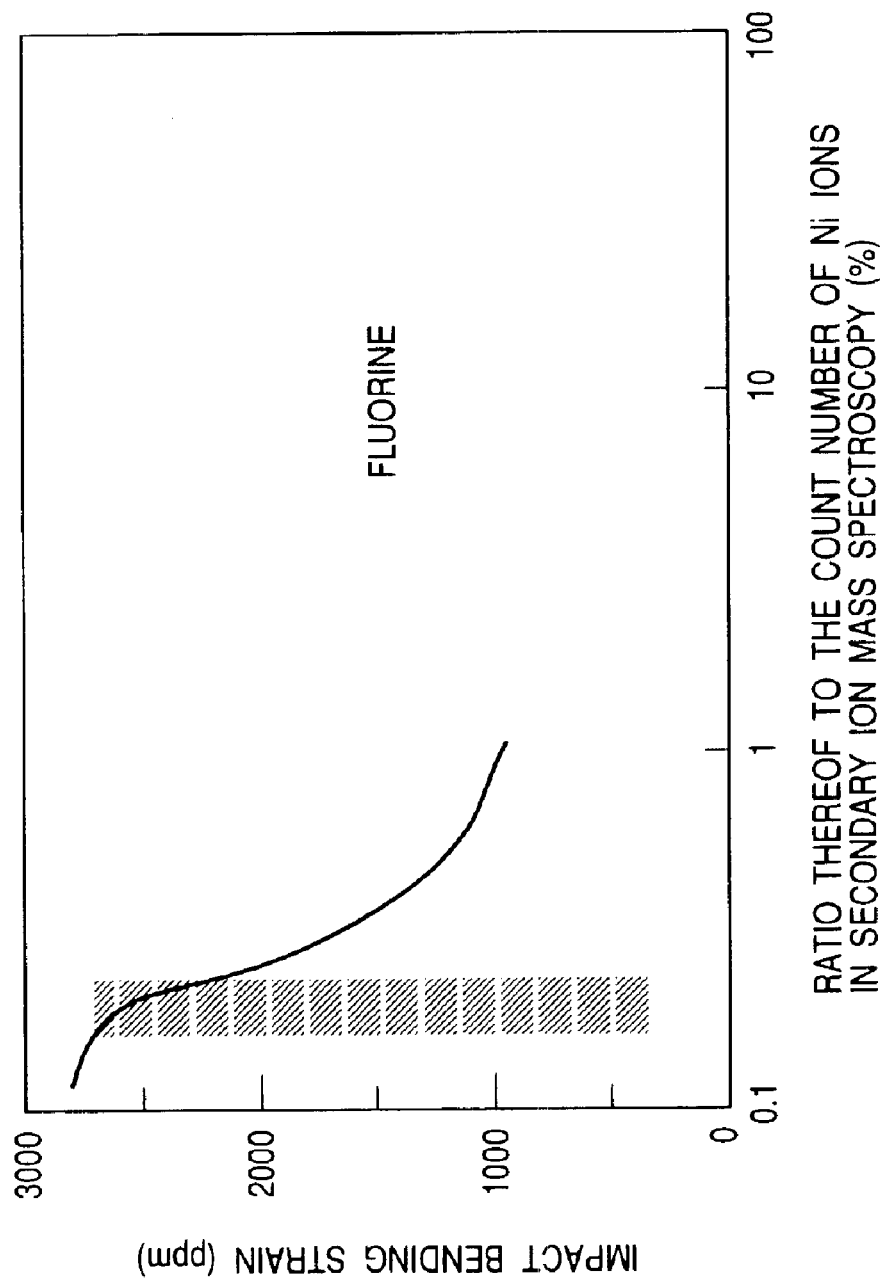
FIG. 23 is a characteristic graph showing a relationship between the fluorine concentration in a jointing layer and the impact strength resistance of a solder joint portion.
Figure 24:
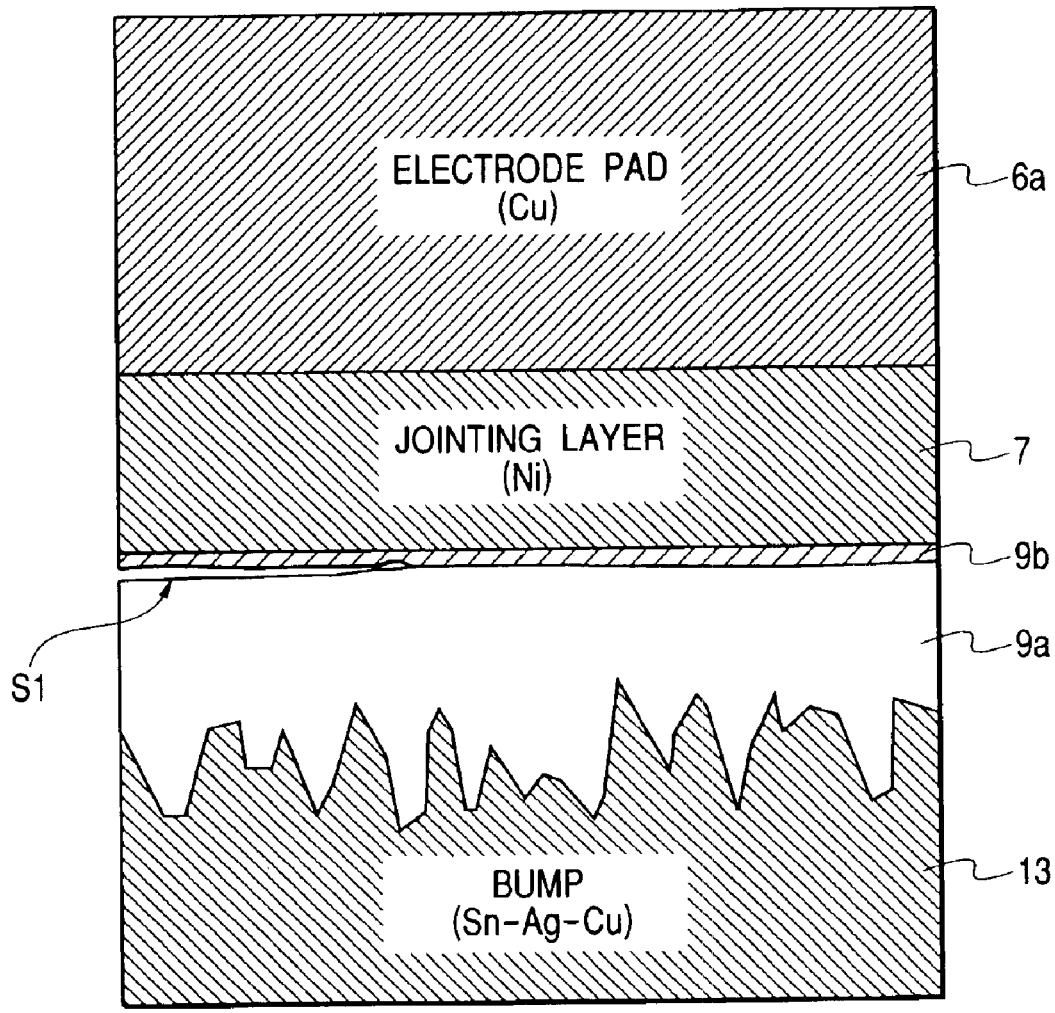
FIG. 24 is a partial sectional view of the solder joint portion in the case that the fluorine concentration in the jointing layer is high.

FIG. 23 is a graph showing a relationship between the fluorine concentration in a jointing layer and the impact strength resistance, and FIG. 24 is a partially sectional view of a solder joint portion in the case that the fluorine concentration in the jointing layer is high. Evaluation about the fluorine concentration is made under the same conditions as in the evaluation about the sulfur concentration.

As illustrated in FIG. 23, the impact strength resistance of the solder joint portion becomes higher as the fluorine concentration in the jointing layer 7 becomes lower. Accordingly, by making the jointing layer 7 to a layer which does not contain fluorine substantially, the impact strength resistance of the solder joint portion in the electrode pad 6 of the interposer 4 can be improved even if the solder bumps 14 having the Pb-free composition are used.

As illustrated in FIG. 24, in the case that the fluorine concentration in the jointing layer is high, two alloy layers (9a, and 9b) are formed between the solder bumps 14 and the jointing layer 7 and a crack S1 is generated in the interface between the alloy layers 9a and 9b. The alloy layers 9a and 9b have the same alloy composition (Sn—Ni—Cu) but are in different crystal states. However, the alloy layer 9b formed on the side of the jointing layer 7 is not made of granular crystal, which is different from the case of sulfur. Since the crack S1 is generated in the interface between the alloy layers 9b and 9a in this way, it is presumed that the adherence strength based on this interface is low.

The generation of the alloy layer 9b starts from the vicinity of a point where the fluorine concentration exceeds 0.2% as the ratio of the fluorine ion number to the count number of the jointing layer ions in the secondary ion mass spectrometry. Accordingly, if the fluorine concentration is 1% or less, the alloy layer 9b is not generated; therefore, even if the solder bumps 14 having the Pb-free composition are used, the impact strength resistance of the solder joint portions in the electrode pads 6 of the interposer 4 can be improved.

Since the impact strength resistance of the solder joint portions in the electrode pads 6 of the interposer 4 can be improved, it is possible to improve the production yield of the module 20 wherein the solder bumps 14 having the Pb-free composition are used to mount the BGA type semiconductor device 1a on the mount board 21.

As illustrated in FIG. 23, the crack of the solder joint portion starts from the vicinity of the point where the fluorine concentration exceeds 0.2% by a strain of 2000 ppm or less. Accordingly, if the fluorine concentration in the jointing layer is 1% or less, the solder joint portion is not cracked even if the portable telephone is dropped in ordinary using environment. It is therefore possible to ensure the reliability, against impact, of the portable telephone 40 into which the module 20, wherein the solder bumps 14 having the Pb-free composition are used to mount the BGA type semiconductor device 1a on the mount board, is integrated.

In the module 20 wherein the BGA type semiconductor device 1a is mounted, the jointing layer 7 is also disposed on the electrode pads 22 of the mount board 21. Accordingly, by making the jointing layer 7 on the electrode pads 22 to a layer which does not contain fluorine substantially, the impact strength resistance of the solder joint portions in the electrode pads 22 of the mount board 21 can be improved even if the solder bumps 14 having the Pb-free composition are used.

Since the impact strength resistance of the solder joint portions in the electrode pads 22 of the mount board 21 can be improved, it is possible to improve the production yield of the module 20 wherein the solder bumps 14 having the Pb-free composition are used to mount the BGA type semiconductor device 1a on the mount board 21. It is also possible to ensure the reliability, against impact, of the portable telephone 40 into which this module 20 is integrated.

Figure 25:
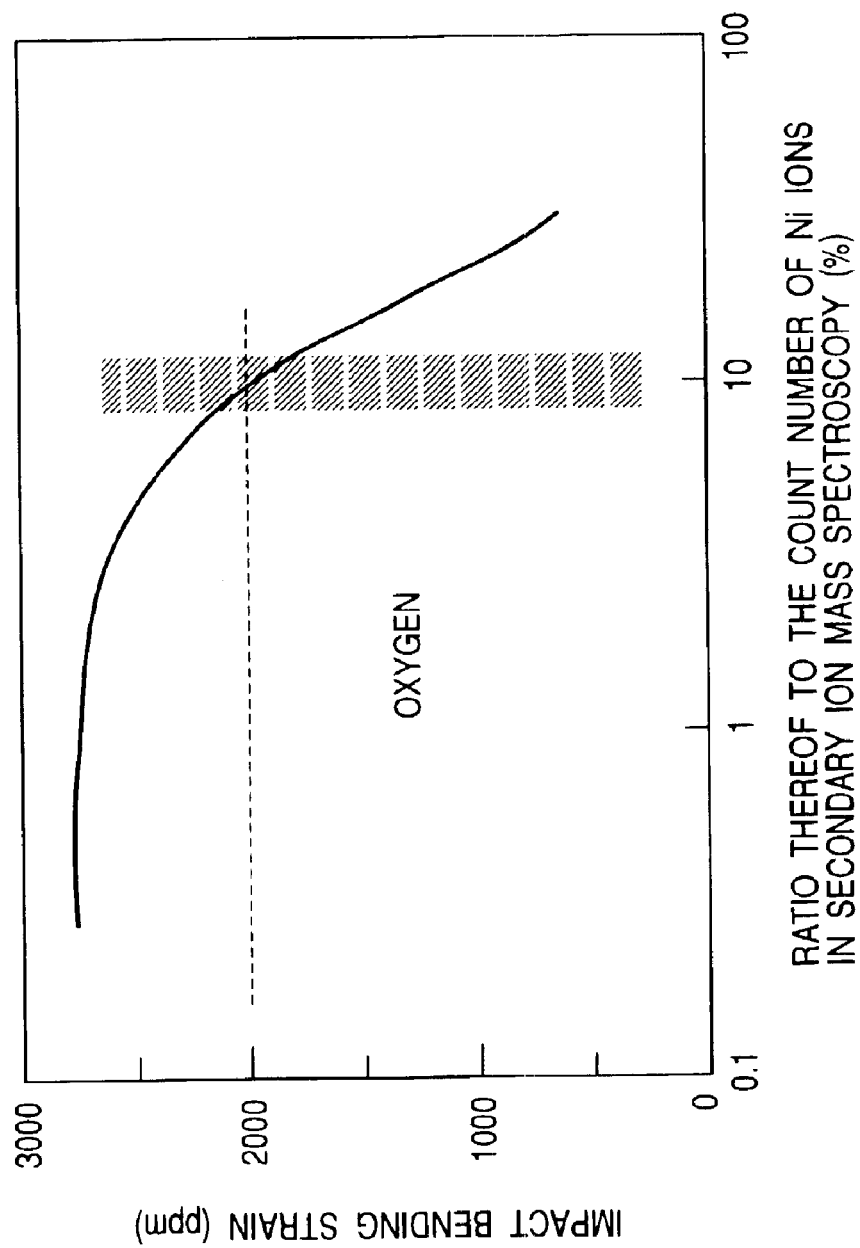
FIG. 25 is a characteristic graph showing a relationship between the oxygen concentration in a jointing layer and the impact strength resistance of a solder joint portion.
Figure 26:
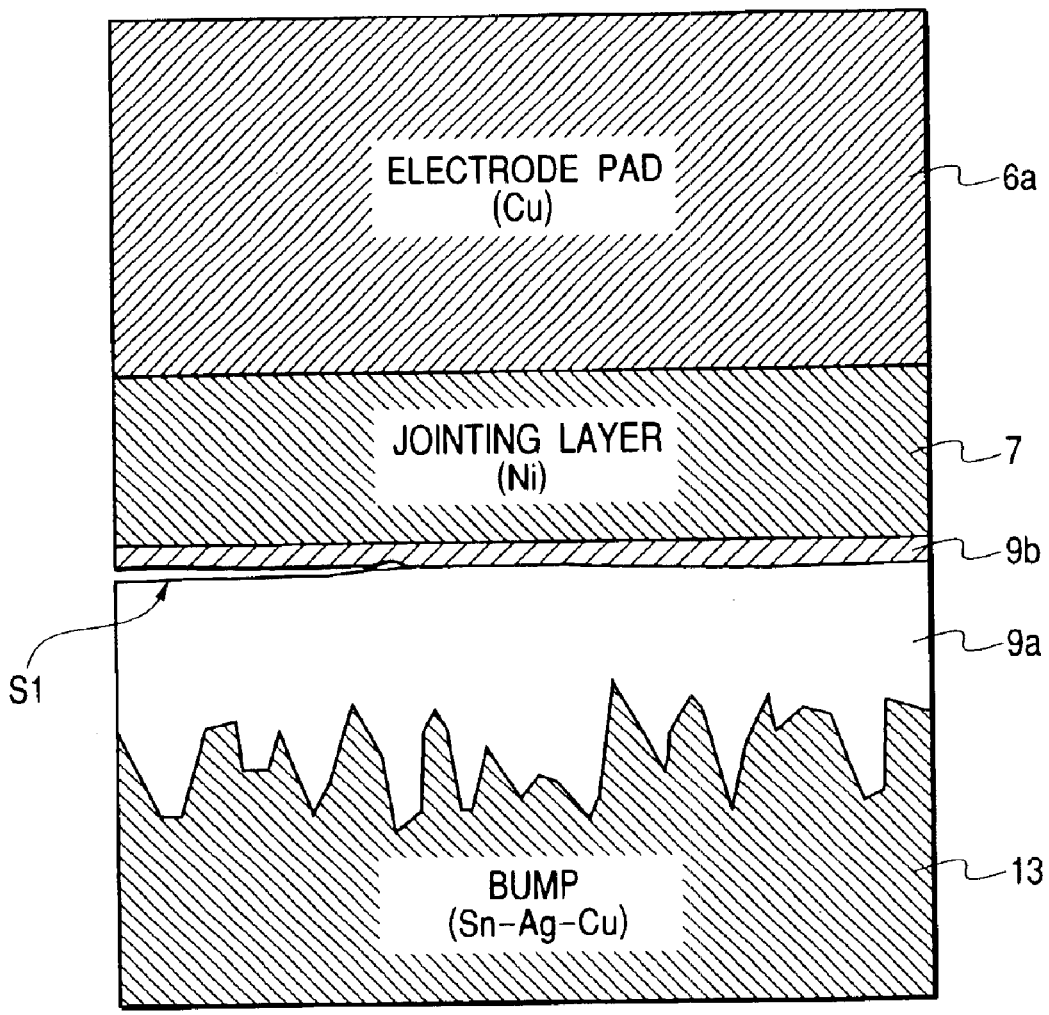
FIG. 26 is a partial sectional view of the solder joint portion in the case that the oxygen concentration in the jointing layer is high.

FIG. 25 is a graph showing a relationship between the oxygen concentration in a jointing layer and the impact strength resistance, and FIG. 26 is a partially sectional view of a solder joint portion in the case that the oxygen concentration in the jointing layer is high. Evaluation about the oxygen concentration is made under the same conditions as in the evaluation about the sulfur concentration.

As illustrated in FIG. 25, the impact strength resistance of the solder joint portion becomes higher as the oxygen concentration in the jointing layer 7 becomes lower. Accordingly, by making the jointing layer 7 to a layer which does not contain oxygen substantially, the impact strength resistance of the solder joint portions in the electrode pads 6 of the interposer 4 can be improved even if the solder bumps 14 having the Pb-free composition are used.

As illustrated in FIG. 26, in the case that the oxygen concentration in the jointing layer is high, two alloy layers (9a, and 9b) are formed between the solder bumps 14 and the jointing layer 7 and a crack S1 is generated in the interface between the alloy layers 9a and 9b. The alloy layers 9a and 9b have the same alloy composition (Sn—Ni—Cu) but are in different crystal states. However, the alloy layer 9b formed on the side of the jointing layer 7 is not made of granular crystal, which is different from the case of sulfur. Since the crack S1 is generated in the interface between the alloy layers 9b and 9a in this way, it is presumed that the adherence strength based on this interface is low.

The generation of the alloy layer 9b starts from the vicinity of a point where the oxygen concentration exceeds 0.2% as the ratio of the oxygen ion number to the count number of the jointing layer ions in the secondary ion mass spectrometry. Accordingly, if the oxygen concentration is 1% or less, the alloy layer 9b is not generated; therefore, even if the solder bumps 14 having the Pb-free composition are used, the impact strength resistance of the solder joint portions in the electrode pads 6 of the interposer 4 can be improved.

Since the impact strength resistance of the solder joint portions in the electrode pads 6 of the interposer 4 can be improved, it is possible to improve the production yield of the module 20 wherein the solder bumps 14 having the Pb-free composition are used to mount the BGA type semiconductor device 1a on the mount board 21.

As illustrated in FIG. 25, the crack of the solder joint portion starts from the vicinity of the point where the oxygen concentration exceeds 10% by a strain of 2000 ppm or less. Accordingly, if the oxygen concentration in the jointing layer is 10% or less, the solder joint portion is not cracked even if the portable telephone is dropped in ordinary using environment. It is therefore possible to ensure the reliability, against impact, of the portable telephone 40 into which the module 20, wherein the solder bumps 14 having the Pb-free composition are used to mount the BGA type semiconductor device 1a on the mount board 20, is integrated.

In the module 20 wherein the BGA type semiconductor device 1a is mounted, the jointing layer 7 is also disposed on the electrode pads 22 of the mount board 21. Accordingly, by making the jointing layer 7 on the electrode pads 22 to a layer which does not contain oxygen substantially, the impact strength resistance of the solder joint portions in the electrode pads 22 of the mount board 21 can be improved even if the solder bumps 14 having the Pb-free composition are used.

Since the impact strength resistance of the solder joint portions in the electrode pads 22 of the mount board 21 can be improved, it is possible to improve the production yield of the module 20 wherein the solder bumps 14 having the Pb-free composition are used to mount the BGA type semiconductor device 1a on the mount board 21. It is also possible to ensure the reliability of the portable telephone 40 into which this module 20 is integrated against impact.

Figure 27:
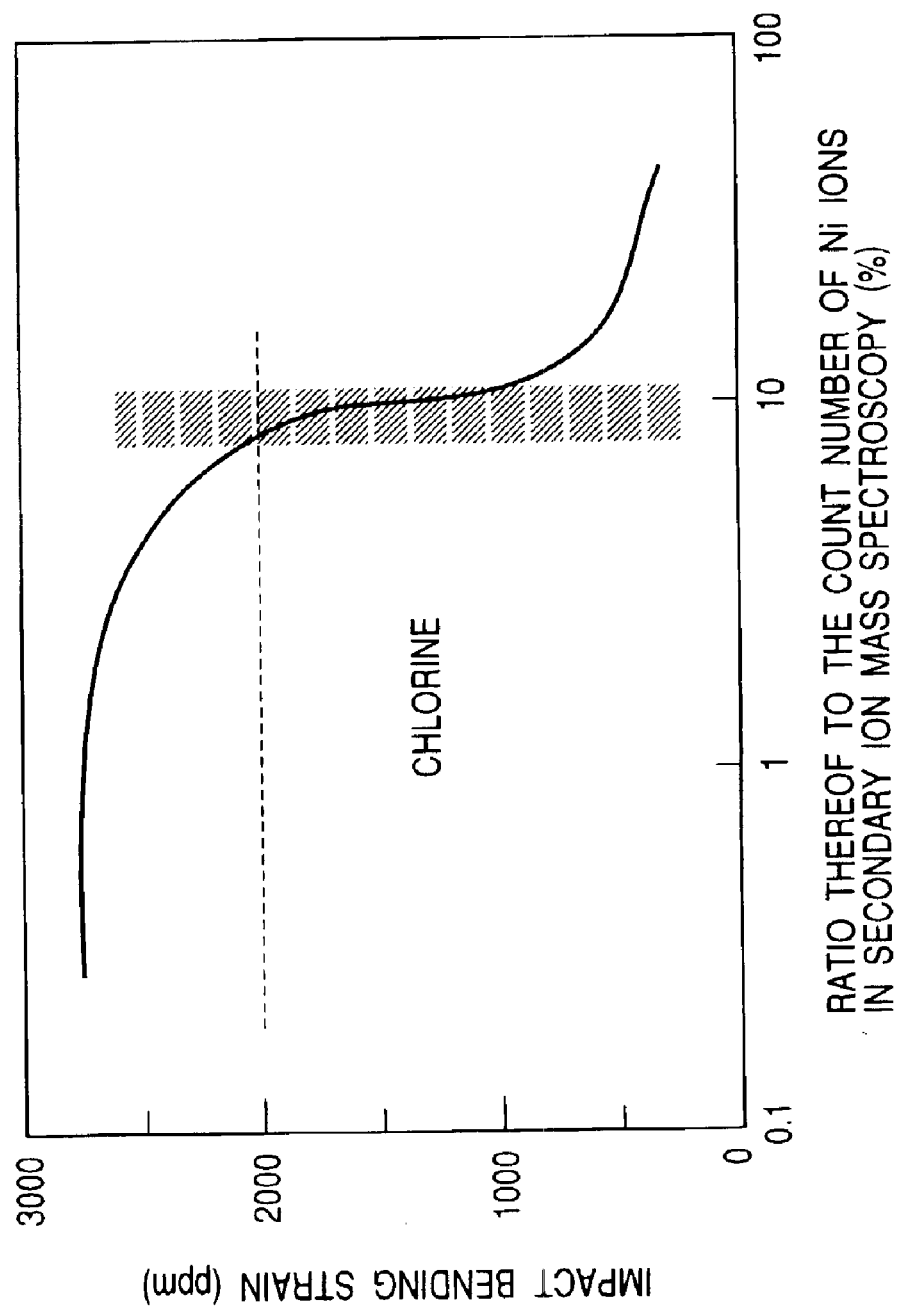
FIG. 27 is a characteristic graph showing a relationship between the chlorine concentration in a jointing layer and the bending strain.

FIG. 27 is a graph showing a relationship between the chlorine concentration in a jointing layer and the impact strength resistance, and FIG. 24 is a partially sectional view of a solder joint portion in the case that the chlorine concentration in the jointing layer is high. Evaluation about the chlorine concentration is made under the same conditions as in the evaluation about the sulfur concentration.

As illustrated in FIG. 27, the impact strength resistance of the solder joint portion becomes higher as the chlorine concentration in the jointing layer 7 becomes lower. Accordingly, by making the jointing layer 7 to a layer which does not contain chlorine substantially, the impact strength resistance of the solder joint portions in the electrode pads 6 of the interposer 4 can be improved even if the solder bumps 14 having the Pb-free composition are used.

Figure 28:
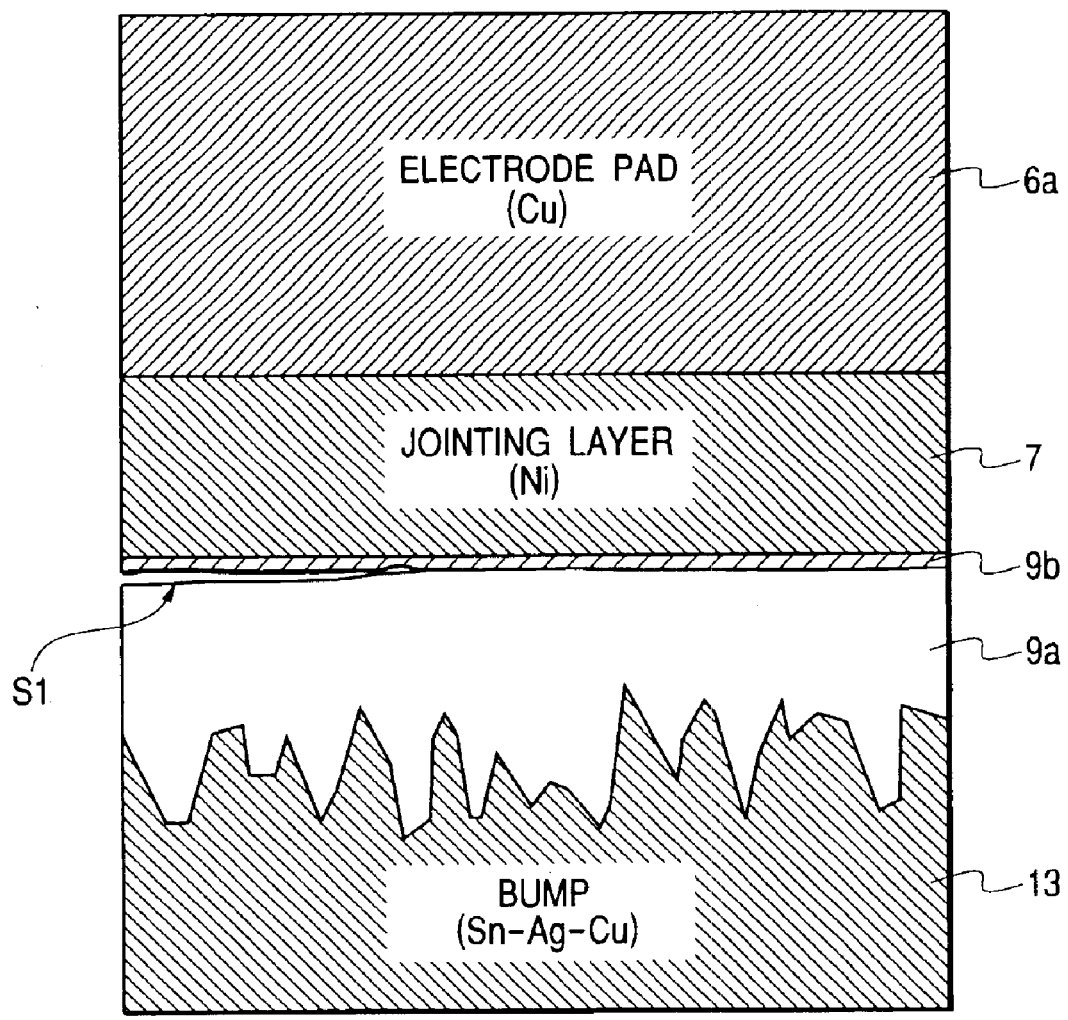
FIG. 28 is a partial sectional view of a solder joint portion in the case that the chlorine concentration in the jointing layer is high.

As illustrated in FIG. 28, in the case that the chlorine concentration in the jointing layer is high, two alloy layers (9a, and 9b) are formed between the solder bumps 14 and the jointing layer 7 and a crack S1 is generated in the interface between the alloy layers 9a and 9b. The alloy layers 9a and 9b have the same alloy composition (Sn—Ni—Cu) but are in different crystal states. However, the alloy layer 9b formed on the side of the jointing layer 7 is not made of granular crystal, which is different from the case of sulfur. Since the crack S1 is generated in the interface between the alloy layers 9b and 9a in this way, it is presumed that the adherence strength based on this interface is low.

The generation of the alloy layer 9b starts from the vicinity of a point where the chlorine concentration exceeds 0.2% as the ratio of the chlorine ion number to the count number of the jointing layer ions in the secondary ion mass spectrometry. Accordingly, if the chlorine concentration is 1% or less, the alloy layer 9b is not generated; therefore, even if the solder bumps 14 having the Pb-free composition are used, the impact strength resistance of the solder joint portions in the electrode pads 6 of the interposer 4 can be improved.

Since the impact strength resistance of the solder joint portions in the electrode pads 6 of the interposer 4 can be improved, it is possible to improve the production yield of the module 20 wherein the solder bumps 14 having the Pb-free composition are used to mount the BGA type semiconductor device 1a on the mount board 21.

As illustrated in FIG. 27, the crack of the solder joint portion starts from the vicinity of the point where the chlorine concentration exceeds 10% by a strain of 2000 ppm or less. Accordingly, if the chlorine concentration in the jointing layer is 10% or less, the solder joint portion is not cracked even if the portable telephone is dropped in ordinary using environment. It is therefore possible to ensure the reliability, against impact, of the portable telephone 40 into which the module 20, wherein the solder bumps 14 having the Pb-free composition are used to mount the BCA type semiconductor device 1a on the mount board, is integrated.

In the module 20 wherein the BGA type semiconductor device 1a is mounted, the jointing layer 7 is also disposed on the electrode pads 22 of the mount board 21. Accordingly, by making the jointing layer 7 on the electrode pads 22 to a layer which does not contain chlorine substantially, the impact strength resistance of the solder joint portions in the electrode pads 22 of the mount board 21 can be improved even if the solder bumps 14 having the Pb-free composition are used.

Since the impact strength resistance of the solder joint portions in the electrode pads 22 of the mount board 21 can be improved, it is possible to improve the production yield of the module 20 wherein the solder bumps 14 having the Pb-free composition are used to mount the BGA type semiconductor device 1a on the mount board 21. It is also possible to ensure the reliability, against impact, of the portable telephone 40 into which this module 20 is integrated.

Embodiment 2

In the present embodiment 2, an example wherein the present invention is applied to an LGA type semiconductor device will be described.

Figure 29:
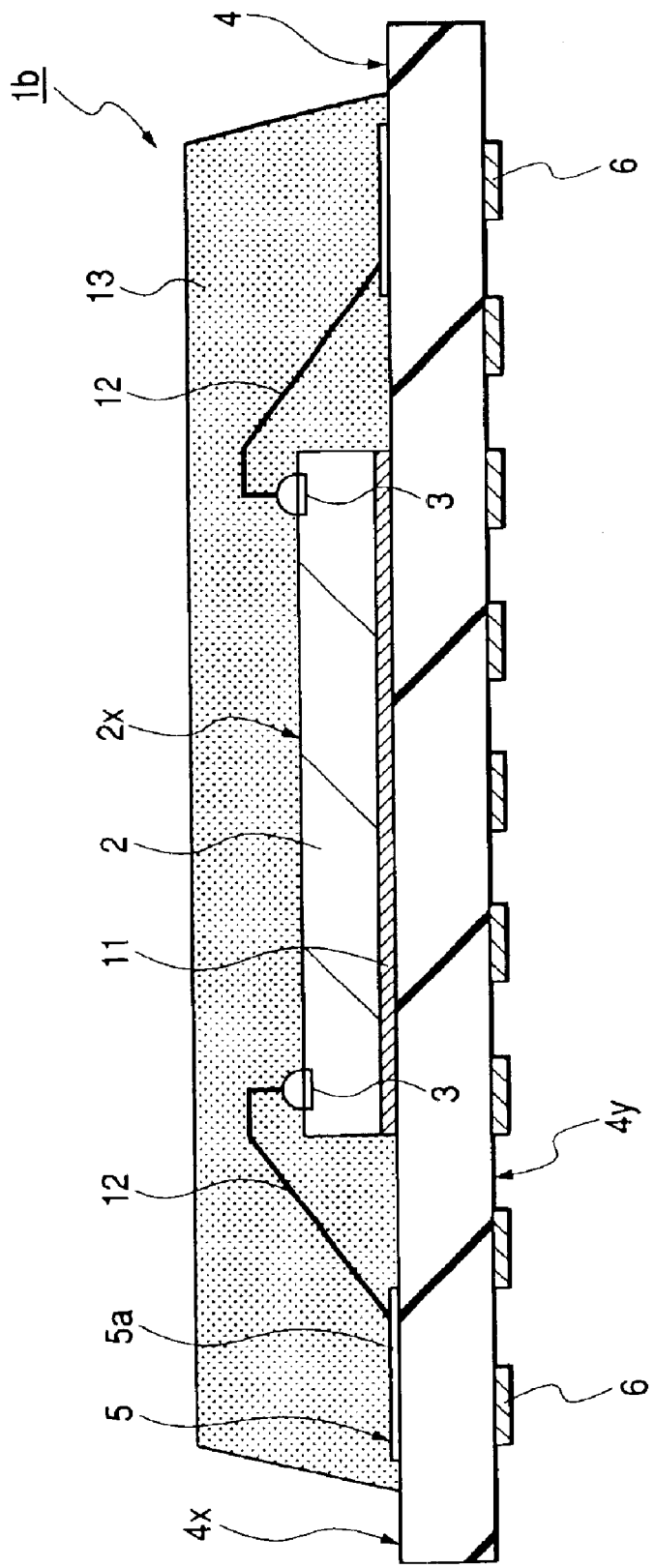
FIG. 29 is a sectional view illustrating an outline of an LGA type semiconductor device according to an embodiment 2 of the present invention.
Figure 30:
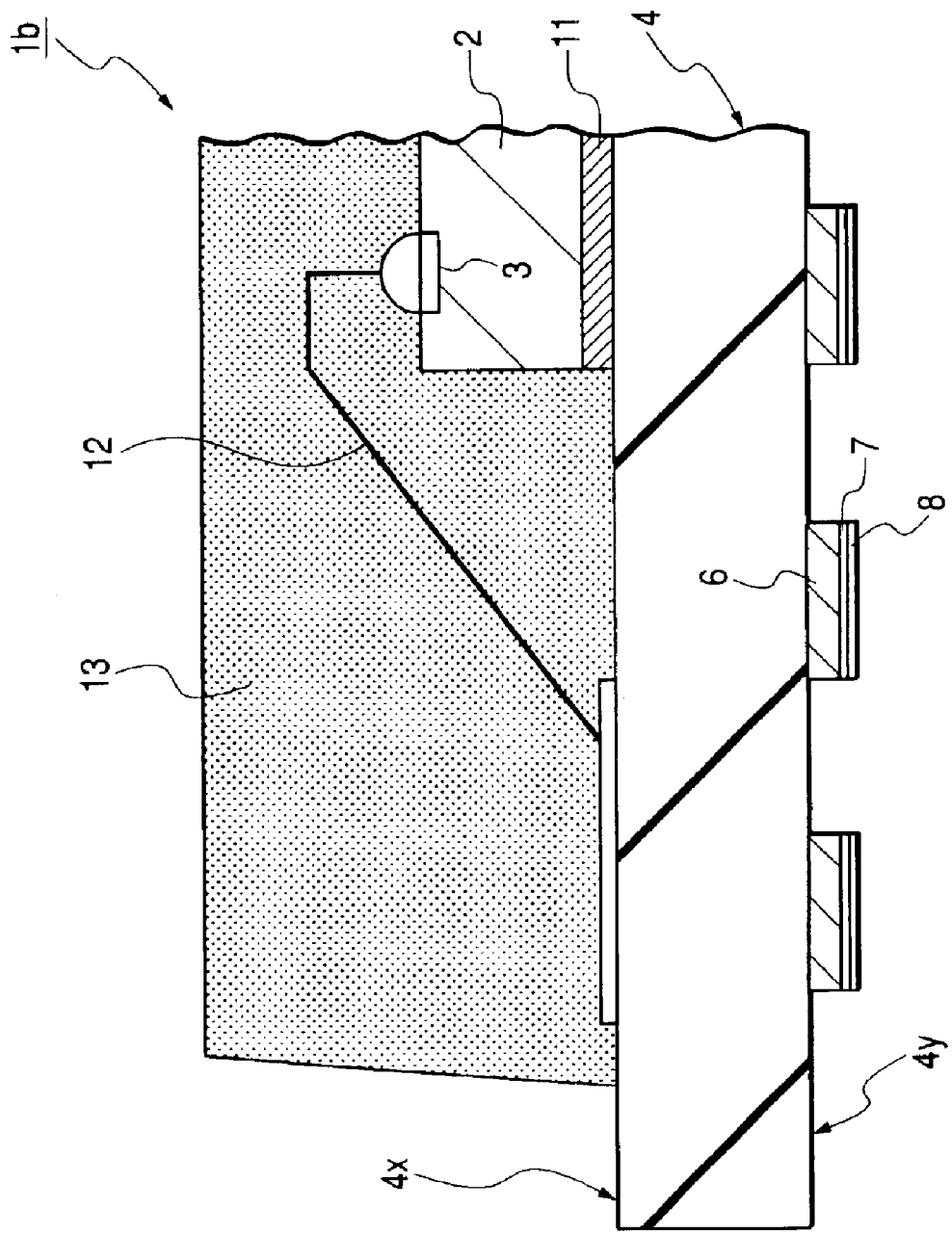
FIG. 30 is a partially enlarged sectional view of FIG. 29.

FIG. 29 is a sectional view illustrating an outline of a semiconductor device according to the present embodiment 2, and FIG. 30 is a partially enlarged sectional view of FIG. 29.

As illustrated in FIG. 29, the LGA type semiconductor device 1b has a structure wherein a semiconductor chip 2 is mounted on the side of a main face 4x of an interposer 4 and plural electrode pads 6 are arranged, as terminals for external connection, on the side of a rear face 4y of the interposer 4.

As illustrated in FIG. 30, a jointing layer 7 made of a Ni plating layer is deposited on the surfaces of the electrode pads 6, and a Au film 8 made of, for example, a plating layer is deposited as an antioxidation film on the surface of the jointing layer 7.

The LGA type semiconductor device 1b is mounted on a mount board with a solder layer being interposed between the electrode pads 6 of the interposer 4 and electrode pads of the mount board. As this solder layer, a solder layer having a Pb-free composition is used. Accordingly, in the LGA type semiconductor device 1b having no solder bumps, by making the jointing layer 7 on the electrode pads 6 to a layer which neither contains sulfur, carbon, nitrogen, oxygen nor chlorine substantially in the same manner as in the above-mentioned embodiment 1, it is possible to improve the impact strength resistance of solder joint portions in the electrode pads 6 of the interposer 4 after the LGA type semiconductor device 1b is mounted on the mount board.

Since the impact strength resistance of the solder joint portions in the electrode pads 6 of the interposer 4 can be improved, it is possible to improve the production yield of the module wherein the solder layer having the Pb-free composition is used to mount the LGA type semiconductor device 1b on the mount board. It is also possible to ensure the reliability, against impact, of the portable telephone into which such a module is integrated.

In a module wherein a solder layer having a Pb-free composition is used to mount the LGA type semiconductor device 1b, which is an electronic member, on a mount board, which is not illustrated in the present embodiment, by making a jointing layer on electrode pads of the mount board to a layer which neither contain carbon, nitrogen, oxygen nor chlorine substantially in the same manner as in the embodiment 1, it is possible to improve the impact strength resistance of solder joint portions in the electrode pads of the mount board after the LGA type semiconductor device 1b is mounted.

Embodiment 3

In the present embodiment 3, an example wherein the present invention is applied to a BGA type semiconductor device having a face down bonding structure will be described.

Figure 31:
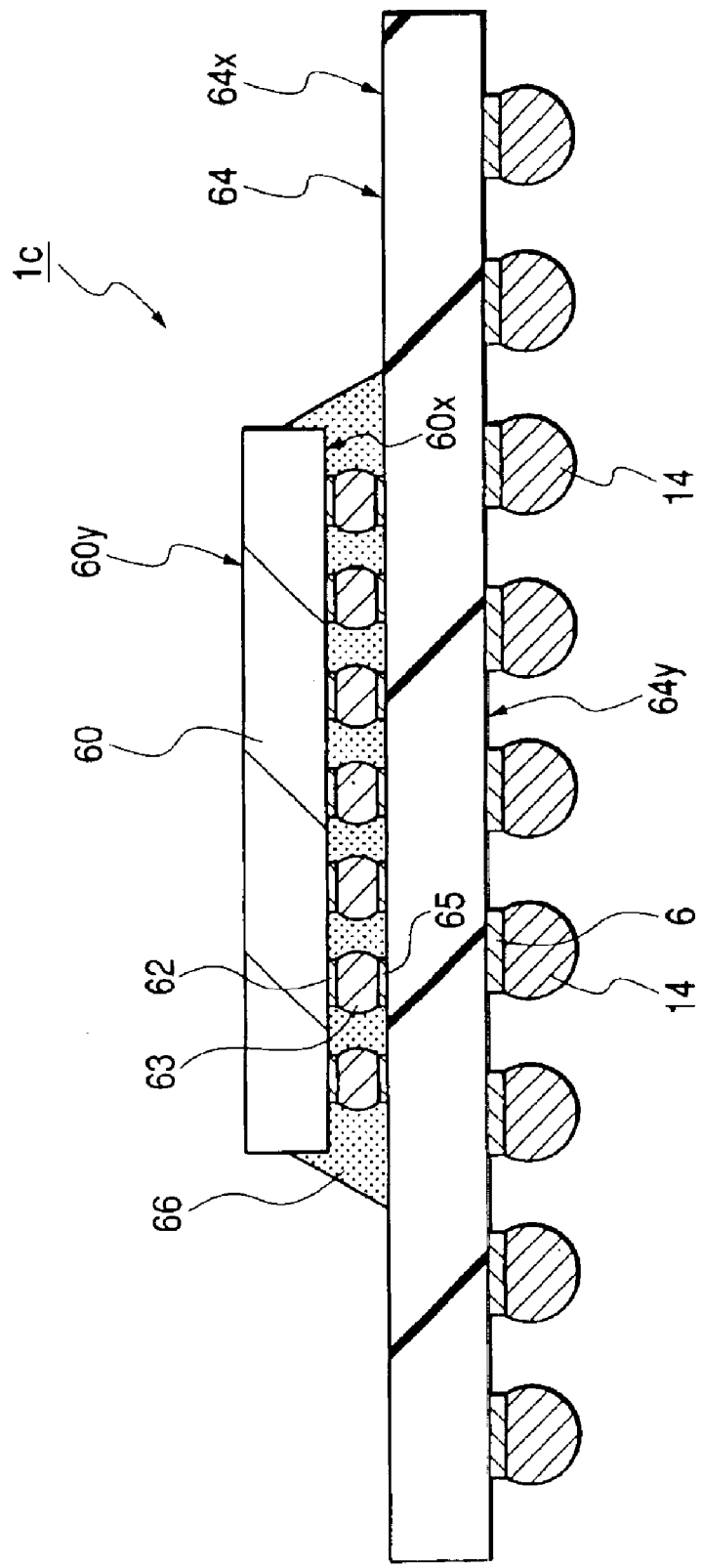
FIG. 31 is a sectional view illustrating an outline of a BGA type semiconductor device having a face down bonding structure according to an embodiment 3 of the present invention.
Figure 32:
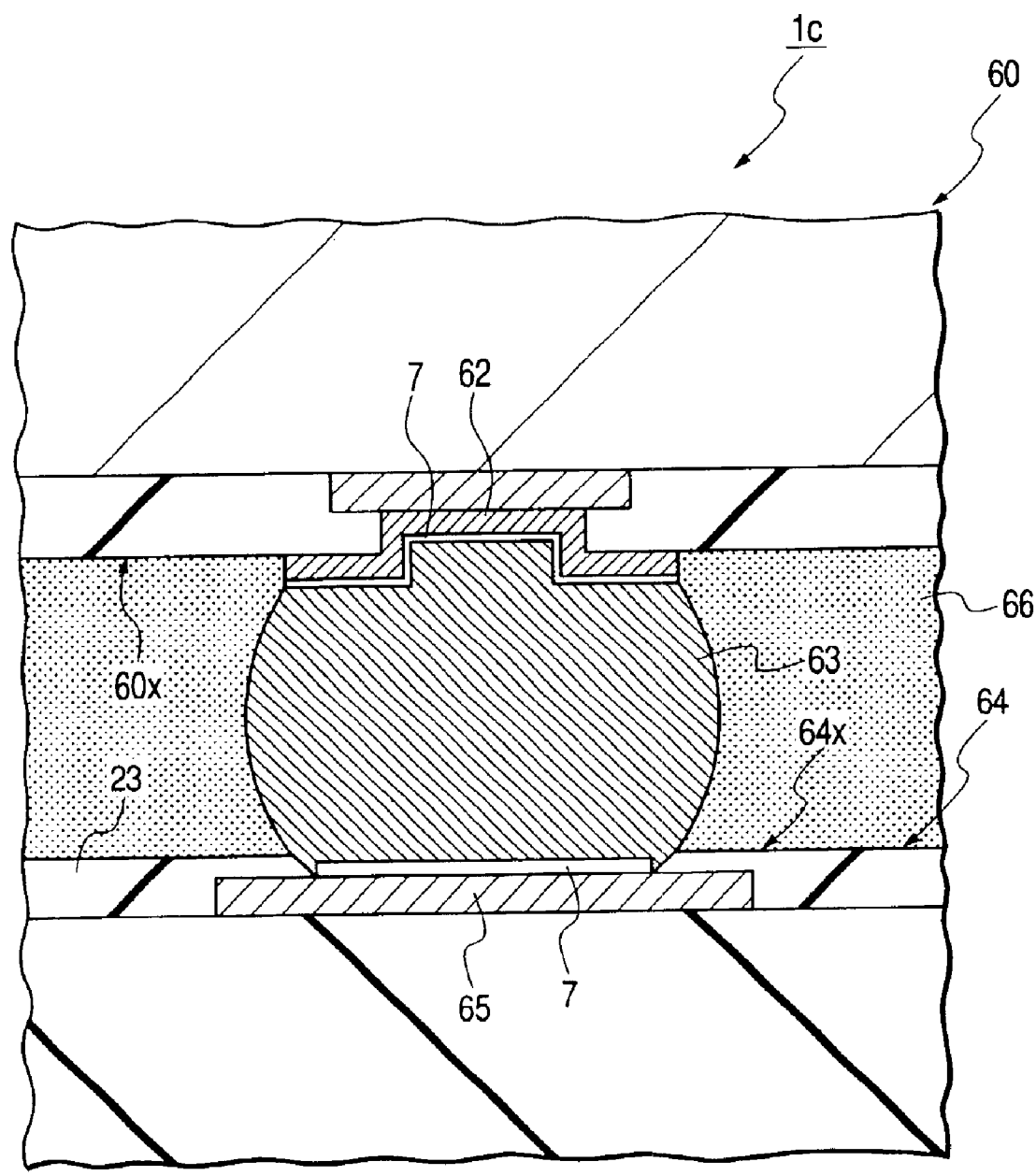
FIG. 32 is a partially enlarged sectional view of FIG. 31.

FIG. 31 is a sectional view illustrating an outline of a BGA type semiconductor device according to the embodiment 3 of the present invention, and FIG. 32 is a partially enlarged sectional view of FIG. 31.

As illustrated in FIG. 31, the BGA type semiconductor device 1c has a structure wherein a semiconductor chip 60 is mounted on the side of a main face 64x of an interposer 64 and plural solder bumps 14 are arranged, as terminals for external connection, on the side of a rear face 64y of the interposer 64.

Plural electrode pads 62 are formed on a main face 60x of the semiconductor chip 60. Plural electrode pads 65 are formed on the main face 64x of the interposer 64, correspondingly to the electrode pads 62 of the semiconductor chip 64, and plural electrode pads 6 are formed on the rear face 64y of the interposer 64. The solder bumps 14 are fixed and bonded onto the electrode pads 6.

The semiconductor chip 60 is mounted on the main face 64x of the interposer 64 in the state that the main face 64x of the chip 60 is opposite to the main face 64x of the interposer 64. The electrode pads 62 of the semiconductor chip 60 are electrically and mechanically connected to the electrode pads 65 of the interposer 64 through the solder bumps 63 interposed between the electrode pads 62 and the electrode pads 65.

As illustrated in FIG. 32, a jointing layer 7 made of a Ni plating layer is deposited on the surfaces of the electrode pads 62, and a jointing layer 7 made of a Ni plating layer is deposited on the surfaces of the electrode pads 65. As the solder bumps 63, solder bumps having a Pb-free composition are used. That is, the jointing layer 7 is formed between the electrode pads 62 and the solder bumps 63, and the jointing layer 7 is formed between the electrode pads 65 and the solder bumps 63. As the solder bumps 63, solder bumps having a Pb-free composition are used. A resin 66 called under-fill is filled into the space between the semiconductor chip 60 and the interposer 64.

The semiconductor chip 60 is mounted on the interposer 64 with the solder bumps 63 having the Pb-free composition being interposed between the electrode pads 62 and the electrode pads 65. Accordingly, by making the jointing layer 7 on the electrode pads 62 and the jointing layer 7 on the electrode pads 65 to layers which neither contain sulfur, carbon, nitrogen, oxygen nor chlorine substantially in the same manner as in the above-mentioned embodiment 1, it is possible to improve the impact strength resistance of solder joint portions in the electrode pads 62 and 65 after the semiconductor chip 60 is mounted on the interposer 64.

Embodiment 4

In the present embodiment 4, an example wherein the present invention is applied to a CSP (chip size package) type semiconductor device will be described.

Figure 33:
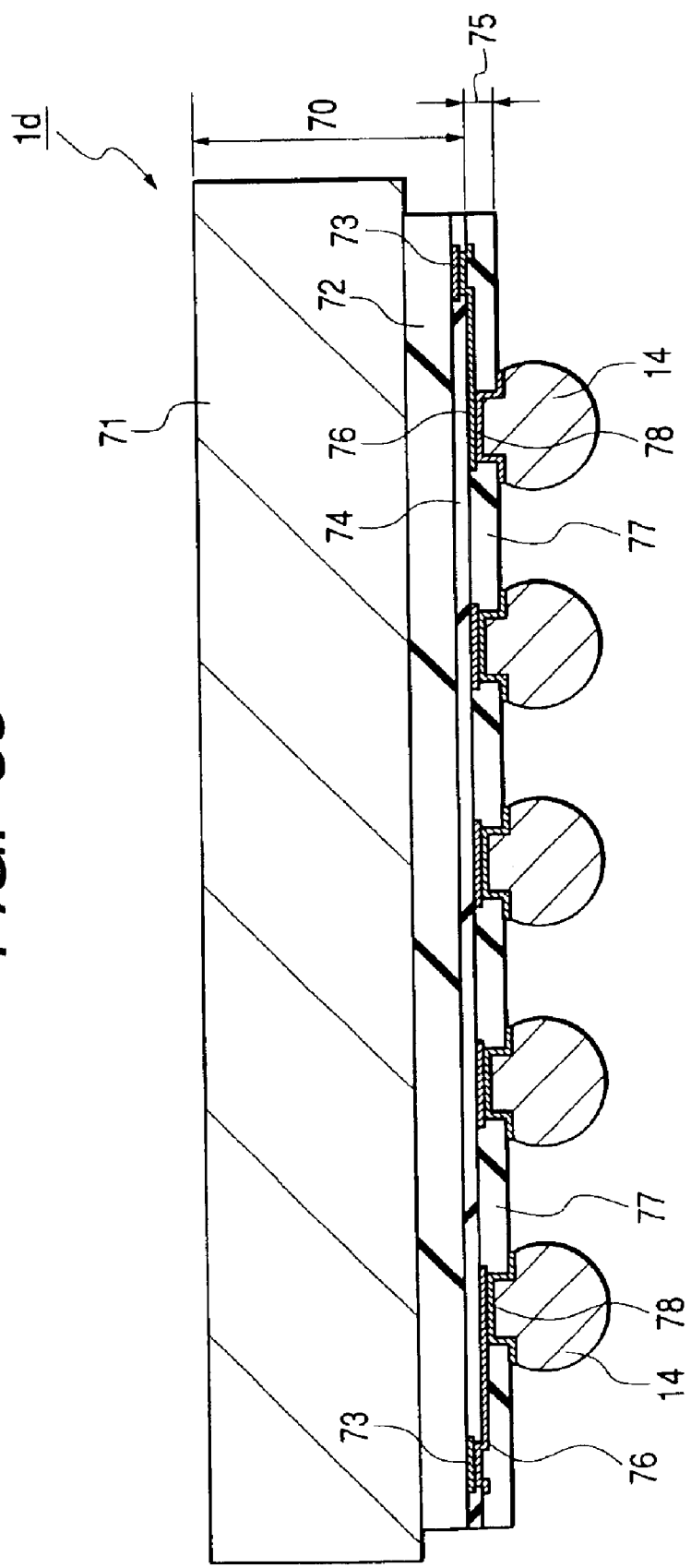
FIG. 33 is a sectional view illustrating an outline of a CSP type semiconductor device according to an embodiment 4 of the present invention.
Figure 34:
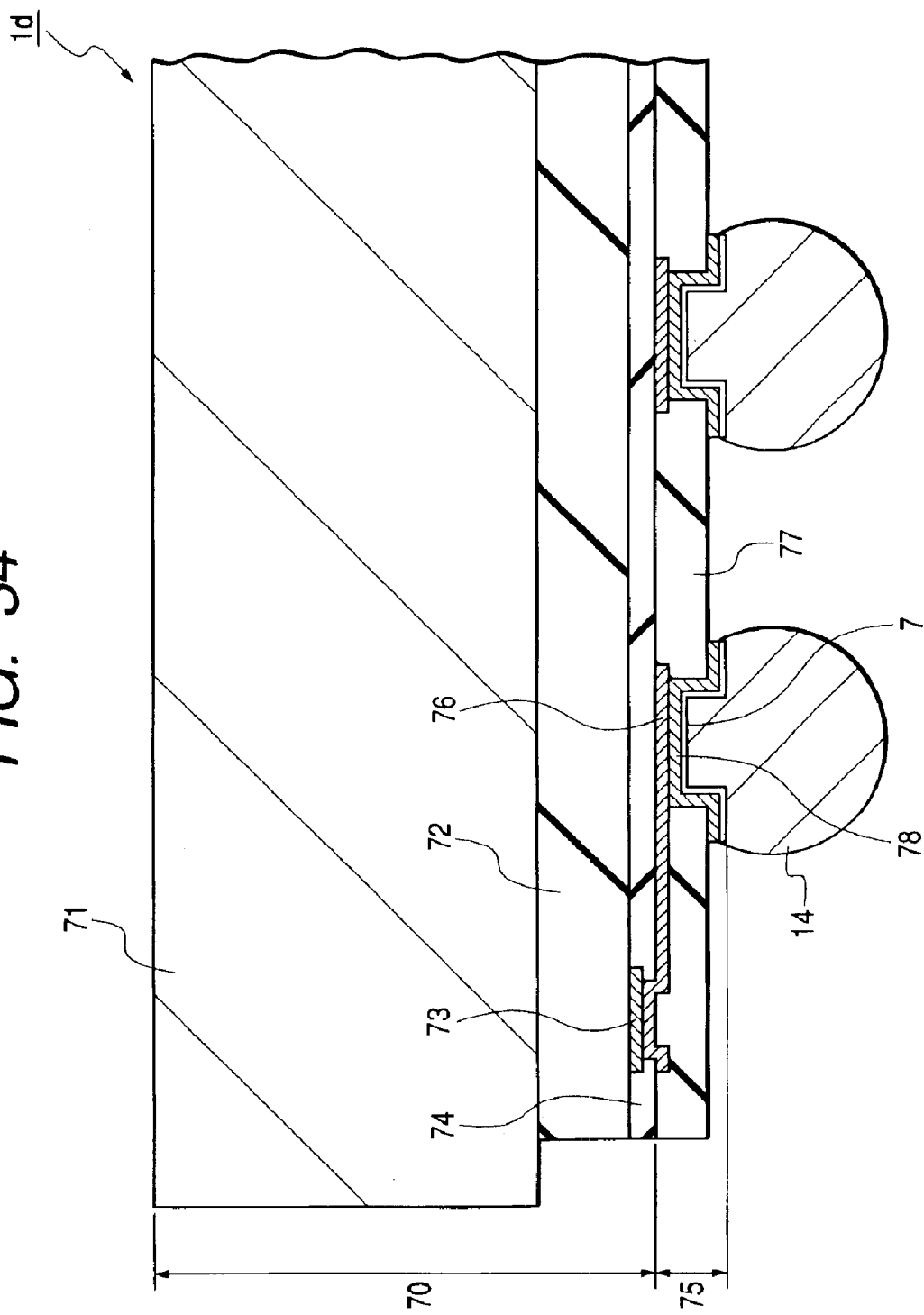
FIG. 34 is a partially enlarged sectional view of FIG. 33.

FIG. 33 is a sectional view illustrating an outline of a semiconductor device according to the embodiment 4 of the present invention, and FIG. 34 is a partially enlarged sectional view of FIG. 33.

As illustrated in FIGS. 33 and 34, the CSP type semiconductor device 1d of the present embodiment 4 has a structure which mainly has a semiconductor chip layer 70, a rewiring layer (pad rearranging layer) 75 formed on a main face of this semiconductor chip layer 70, and plural solder bumps 14 arranged on this rewiring layer 75.

The semiconductor chip layer 70 has a structure which mainly has a semiconductor substrate 71, a multilayered wiring layer 72 in which plural laminates, each of which is made of an insulating layer and a wiring layer, are stacked, and a surface protective film 74 formed to cover this multilayered wiring layer 72. The semiconductor substrate 71 is made of, for example, monocrystal silicon, and the insulating layer of the layers which constitute the multilayered wiring layer 72 is made of, for example, a silicon oxide film, and the wiring layer of the layers which constitute the multilayered wiring layer 72 is made of, for example, an aluminum (Al) film or an aluminum alloy film. The surface protective film 74 is made of, for example, a silicon nitride film.

Plural electrode pads 73 are formed on the main face of the semiconductor chip layer 70, and the electrode pads 73 are arranged along two sides opposite to each other of the CSP type semiconductor device 1d. Each of the electrode pads 73 is formed on the topmost wiring layer of the layers which constitute the multilayered wiring layer 72. The topmost wiring layer of the layers which constitute the multilayered wiring layer 72 is covered with the surface protective film 74 formed thereon, and openings from which the surfaces of the electrode pads 73 are exposed are made in this surface protective film 74.

The rewiring layer 75 has a structure which mainly has an insulating layer (not illustrated) formed on the surface protective film 74, plural wires 76 extending on this insulating layer, an insulating layer 77 formed on the insulating layer to cover the wires 76, and electrode pads 78 formed on the insulating layer 77.

One end of each of the wires 76 is electrically and mechanically connected to each of the electrode pads 73 through an opening made in the insulating layer beneath the wires and an opening made in the surface protective film 74.

Each of solder bumps 14 arranged in the rewiring layer 75 is electrically and mechanically connected to each of the electrode pads 78. As the solder bumps 14, there are used Pb-free solder bumps which do not contain Pb substantially, for example, solder bumps having a composition of Sn-3[wt %]Ag-0.5[wt %]Cu.

The rewiring layer 75 is a layer for rearranging the electrode pads 78 having a wider arrangement pitch than the electrode pads 73 of the semiconductor chip layer 70. The electrode pads 78 of the rewiring layer 75 are arranged at the same arrangement pitch as the arrangement pitch of the electrode pads of the mount board on which the CSP type semiconductor device 1d is mounted.

As illustrated in FIG. 34, a jointing layer 7 is formed on the surface of the electrode pads 78 in order to make the bondability between the electrode pads 78 and the solder bumps 14. In the present embodiment, the jointing layer 7 is made of a Ni plating layer which mainly comprises Ni and does not contain sulfur substantially.

The CSP type semiconductor device 1d is mounted on the mount board with the solder bumps 14 being interposed between the electrode pads 78 and the electrode pads of the mount board. Accordingly, by making the jointing layer 7 on the electrode pads 78 to a layer which neither contains sulfur, carbon, nitrogen, oxygen nor chlorine substantially in the same manner as in the above-mentioned embodiment 1, it is possible to improve the impact strength resistance of solder joint portions after the semiconductor device 1d is mounted on the mount board.

In the embodiments 1 to 4, examples wherein the jointing layer 7 is made of the Ni plating layer which mainly comprises nickel have been described, but the jointing layer 7 may be a plating layer which mainly comprises nickel and phosphorus. This plating layer is formed by electroless deposition.

The invention made by the present inventors has been specifically described on the basis of the above-mentioned embodiments hereinbefore. However, the present invention is not limited to the above-mentioned embodiments, and can be changed or modified within the scope which does not depart from the subject matter thereof.

For example, the present invention can be applied to an electronic instrument called MCM (multiple chip module), wherein Pb-free solder bumps are used to mount plural semiconductor chips on a mount board.

The present invention can also be applied to a portable electronic instrument, such as an IC (integrated circuit) card or PDA (personal digital assistant) into which a module wherein Pb-free solder bumps are used to mount a semiconductor device on a mount board is integrated.

Advantageous effects which are obtained by typical embodiments of the present invention disclosed in the present application are briefly described as follows.

According to the present invention, the impact strength resistance of solder connection portions can be improved.

What is claimed is:

1. A semiconductor device comprising a joint structure having a copper underlying conductive layer, a nickel jointing layer formed on the copper underlying conductive layer, a Pb-free solder layer formed over the nickel jointing layer, and a tin-based alloy layer comprising elements of these layers formed between the nickel jointing layer and the Pb-free solder layer;

wherein sulfur concentration in the nickel jointing layer is less than 1% as the ratio of the sulfur ion number to the ion count number of the jointing layer in secondary ion mass spectrometry so that an impact bending strain exceeds 2000 ppm.

2. The semiconductor device according to claim 1, wherein the nickel jointing layer is a plating layer made mainly of nickel and phosphorus.

3. The semiconductor device according to claim 1, wherein the Pb-free solder layer is a bump.

4. The semiconductor device according to claim 1, wherein the copper underlying conductive layer is an electrode pad of a wiring board, wherein the nickel jointing layer is a plating layer formed on the surface of the electrode pad, and wherein the Pb-free solder layer is a bump jointed to the jointing layer.

5. The semiconductor device according to claim 1, further comprising a wiring board in which an electrode pad is formed on its rear face opposite to its main face, and a semiconductor chip mounted on the main face of the wiring board, wherein the copper underlying conductive layer is an electrode pad of the wiring board, wherein the nickel jointing layer is a plating layer formed on the surface of the electrode pad, and wherein the Pb-free solder layer is a bump jointed to the jointing layer.

* * * * *